United States Patent [19]

Jaeger et al.

[11] Patent Number: 5,253,272
[45] Date of Patent: Oct. 12, 1993

[54] DIGITAL DATA TRANSMISSION SYSTEM WITH ADAPTIVE PREDISTORTION OF TRANSMITTED PULSES

[75] Inventors: Kevin A. Jaeger, Glen Ellen; Gerald L. Somer, Sebastopol, both of Calif.

[73] Assignee: AMP Incorporated, Harrisburg, Pa.

[21] Appl. No.: 632,434

[22] Filed: Mar. 1, 1991

[51] Int. Cl.$^5$ .................. H04K 25/03; H04H 25/49
[52] U.S. Cl. ........................ 375/60; 375/12; 178/69 N
[58] Field of Search .............. 375/60, 11, 12; 332/107; 328/59; 333/17.1, 165, 18; 178/63 E, 63 B, 69 N; 364/724.16, 724.13, 825, 724.2

[56] References Cited

U.S. PATENT DOCUMENTS

| | | | |
|---|---|---|---|
| 3,348,153 | 10/1967 | Featherston | 375/82 |
| 3,543,009 | 11/1970 | Voelcker, Jr. | 375/11 |
| 3,573,624 | 4/1971 | Hartmann | 375/12 |
| 3,727,153 | 4/1973 | McAuliffe | 375/14 X |
| 3,793,589 | 2/1974 | Puckette | 375/61 |
| 4,323,864 | 4/1982 | Ogawa et al. | 333/165 |
| 4,535,443 | 8/1985 | Korevaar | 375/14 X |
| 4,568,842 | 2/1986 | Koike | 307/279 |
| 4,573,166 | 2/1986 | Frederick | 375/90 |
| 4,745,622 | 5/1988 | Gulata | 375/60 X |
| 4,773,082 | 9/1988 | Somer et al. | 375/60 |
| 4,784,094 | 11/1988 | Eguchi | 375/60 |

FOREIGN PATENT DOCUMENTS 0015681 9/1980 European Pat. Off. .
86/03356 6/1986 PCT Int'l Appl. .

OTHER PUBLICATIONS

IEEE 802.9/105, Physical Medium (High Rate) Sub—Group IVD LAN Interface Working Group, Sep. 7, 1989, entitled: On the Selection of Line Signal Modulation; by: Chandos A. Rypinski.
IEEE 802.9/111, IVD LAN Interface Working Group, Oct. 23, 1989, entitled: Minutes of Interim Meeting Toronto, Ontario, Sep. 18–22, 1989.
IEEE 802.9-89/123, IVD LAN Interface Working Group, Nov. 1, 1989; entitled: Report on NRZST Line Signal Experimental Results; by: Chandos A. Rypinski.
IEEE Transactions on Communication Technology, vo. COM-16, No. 1, 1968, pp. 81-93, "Generation of Digital Signal Wave Forms", by H. B. Volker.

Primary Examiner—Curtis Kuntz
Assistant Examiner—Tesfalaet Bocure

[57] ABSTRACT

A digital data transmission system includes a transmitter connected to a receiver by a twisted pair. A digital transversal filter, included in the transmitter, supplies output signals to one of four resistor banks, as determined by an automatic selection system that selects one of the resistor banks based on the measured transmission characteristics of the twisted pair. The output signals are weighted by the resistors of the selected resistor bank, summed, and used to generate the transmitted pulse. The values of the resistors of each resistor bank are chosen to shape the transmitted pulse for a respective length of transmission medium so that, after distortion by the transmission medium, the transmitted pulse more nearly corresponds to the ideal pulse shape for which the receiver is designed.

21 Claims, 34 Drawing Sheets

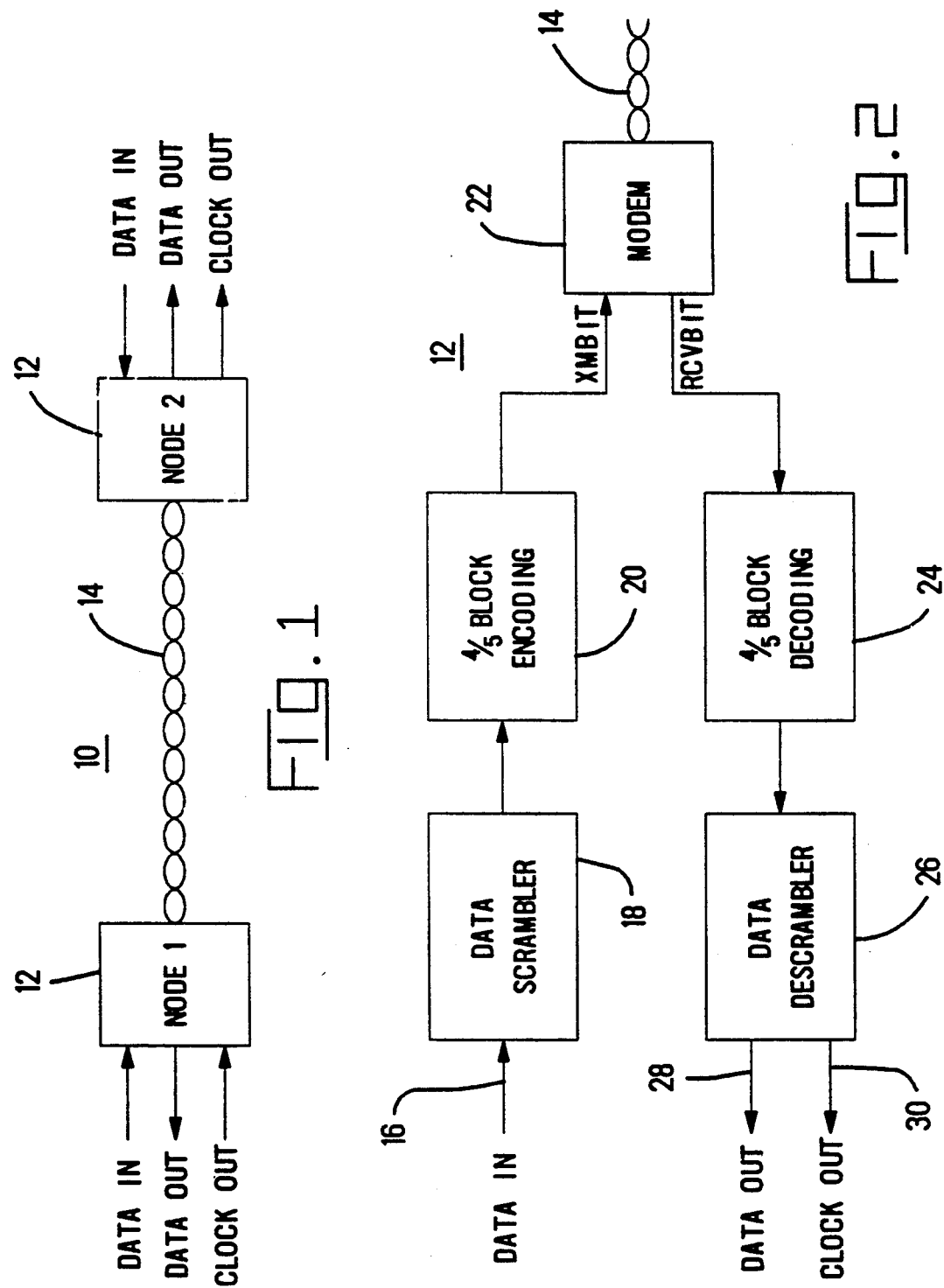

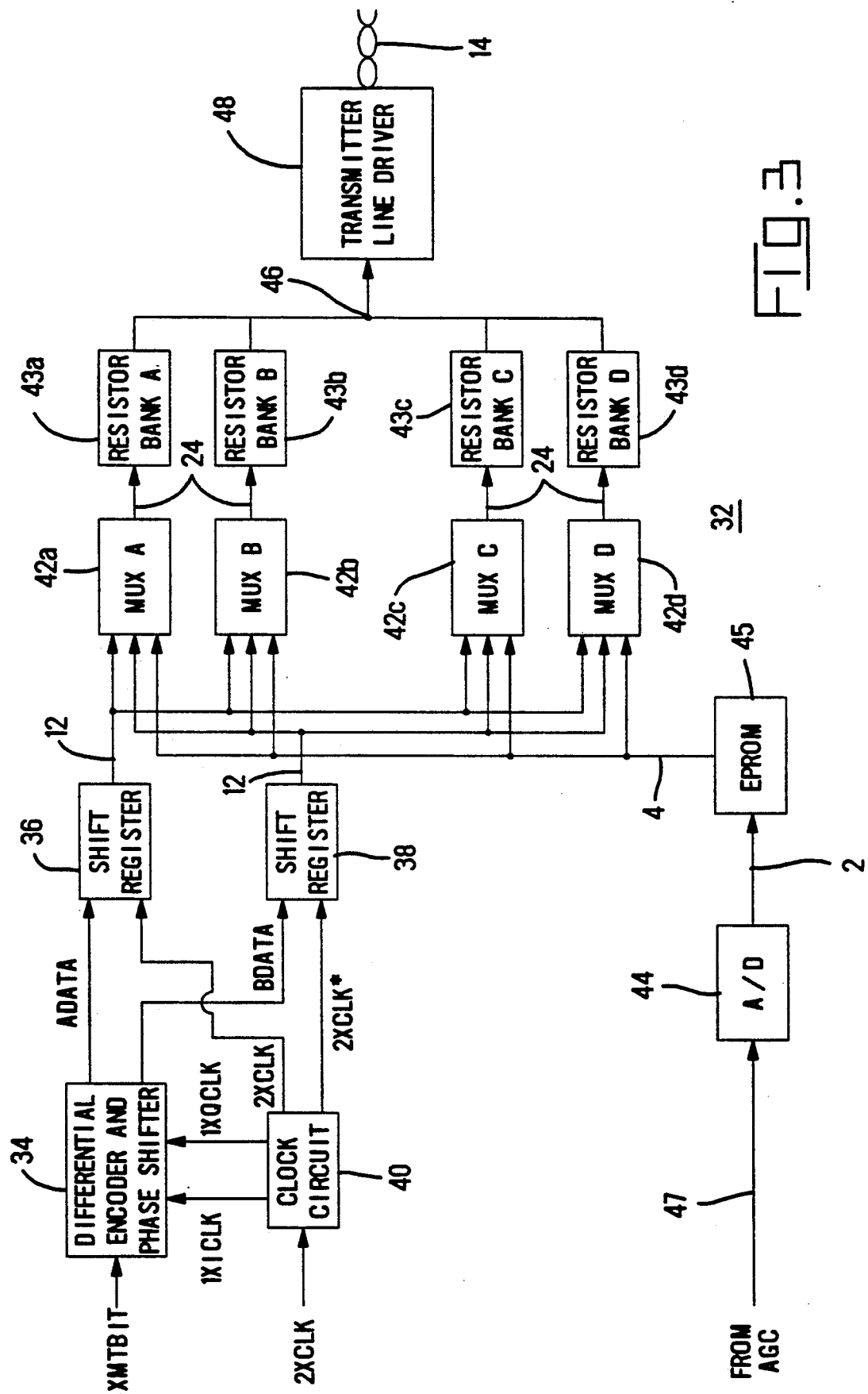

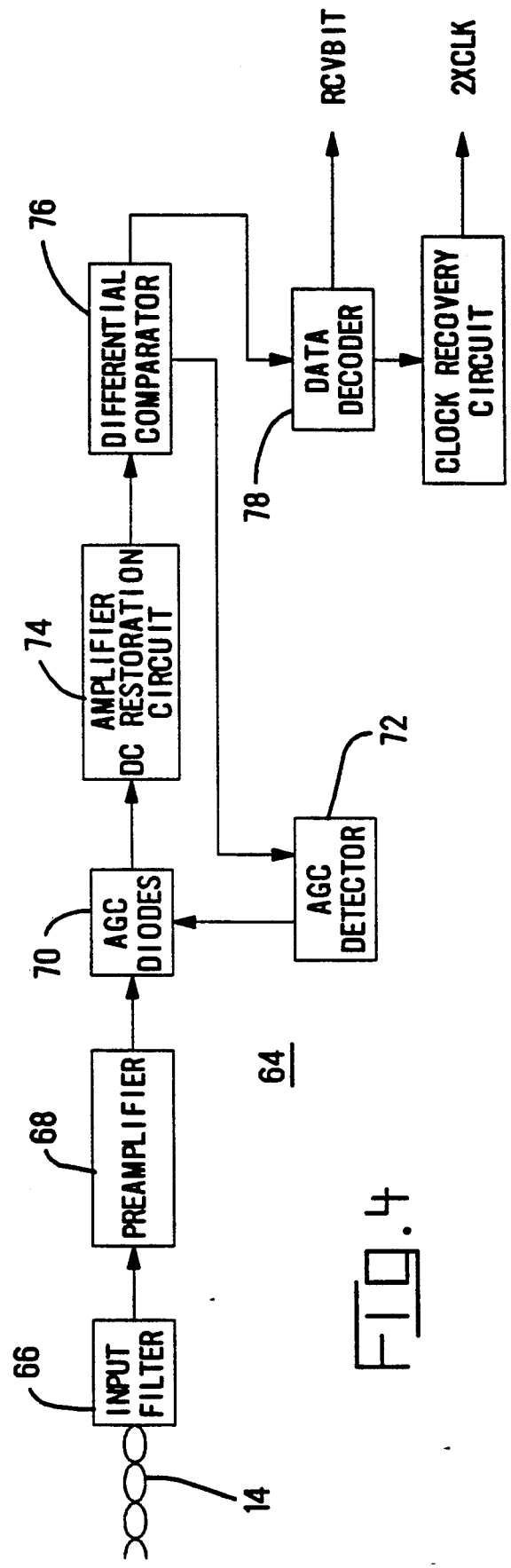

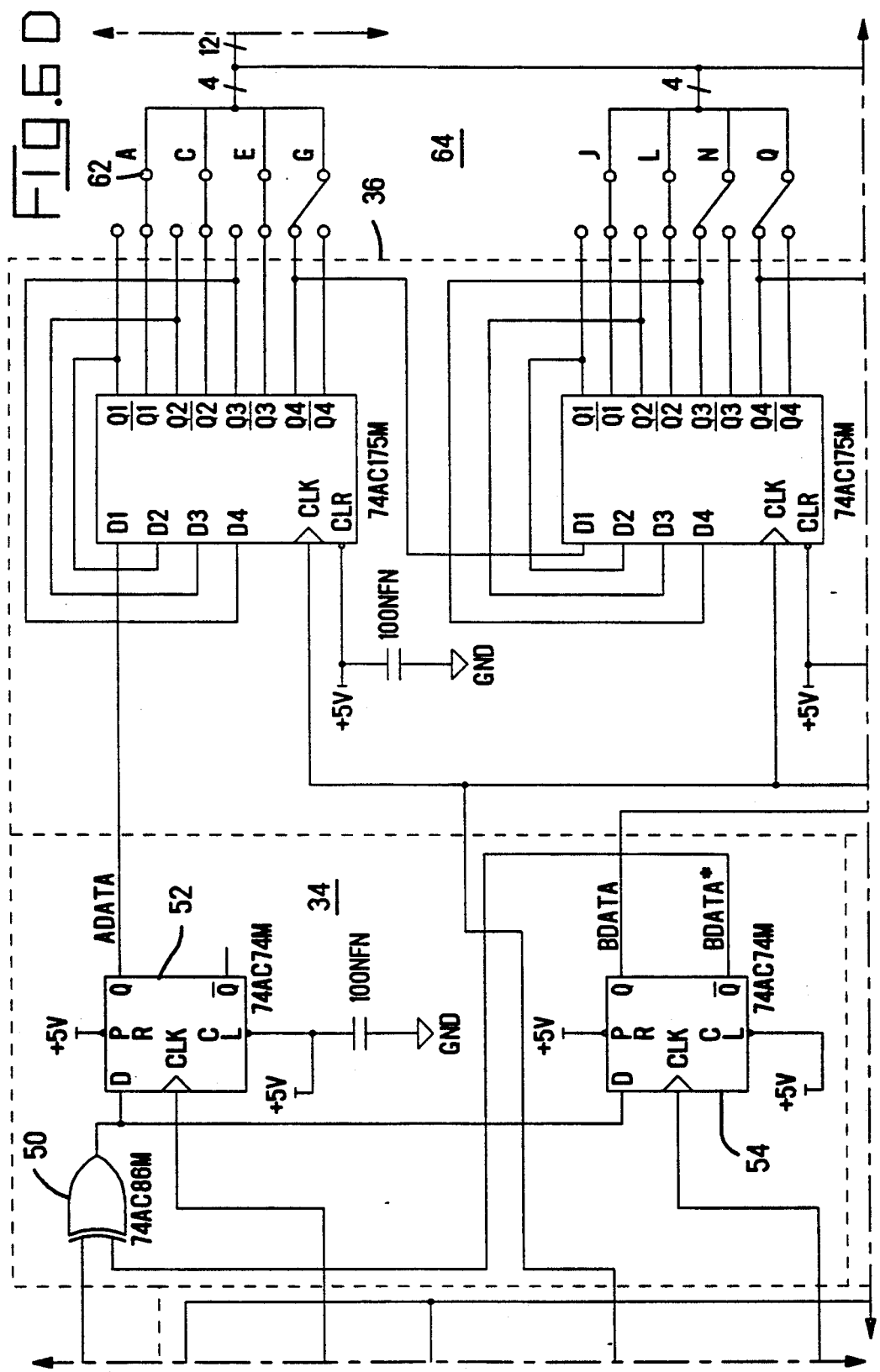

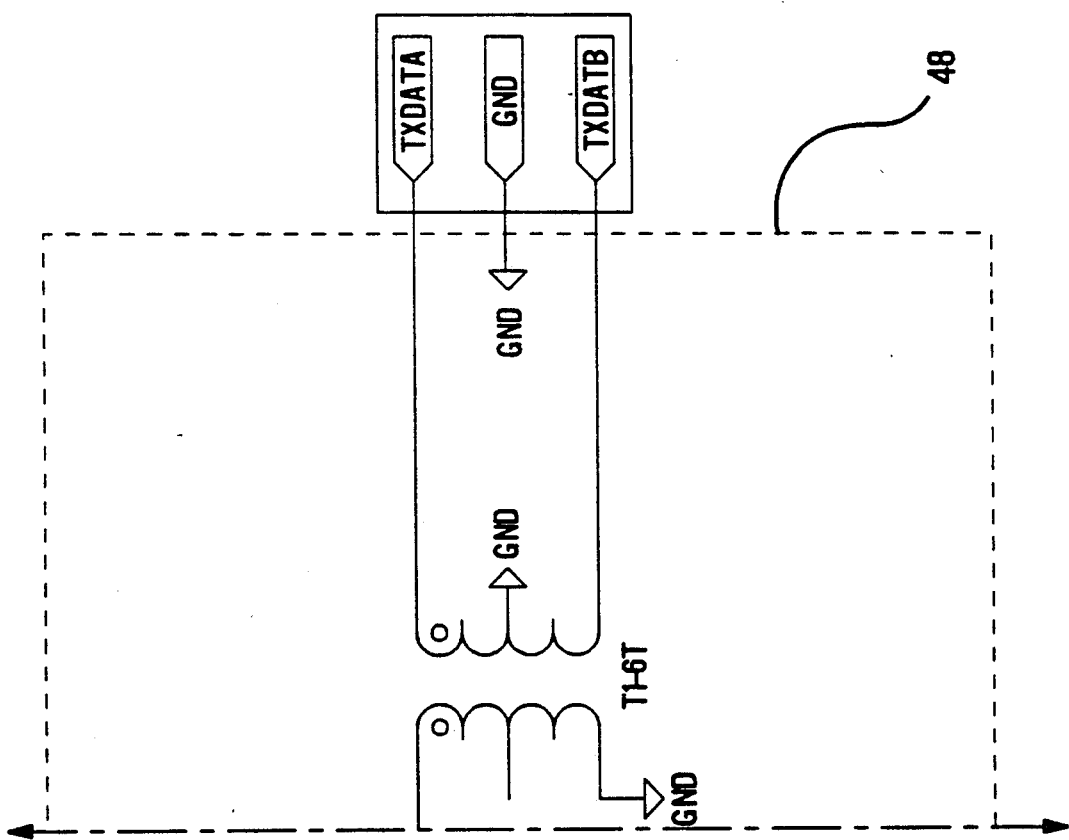

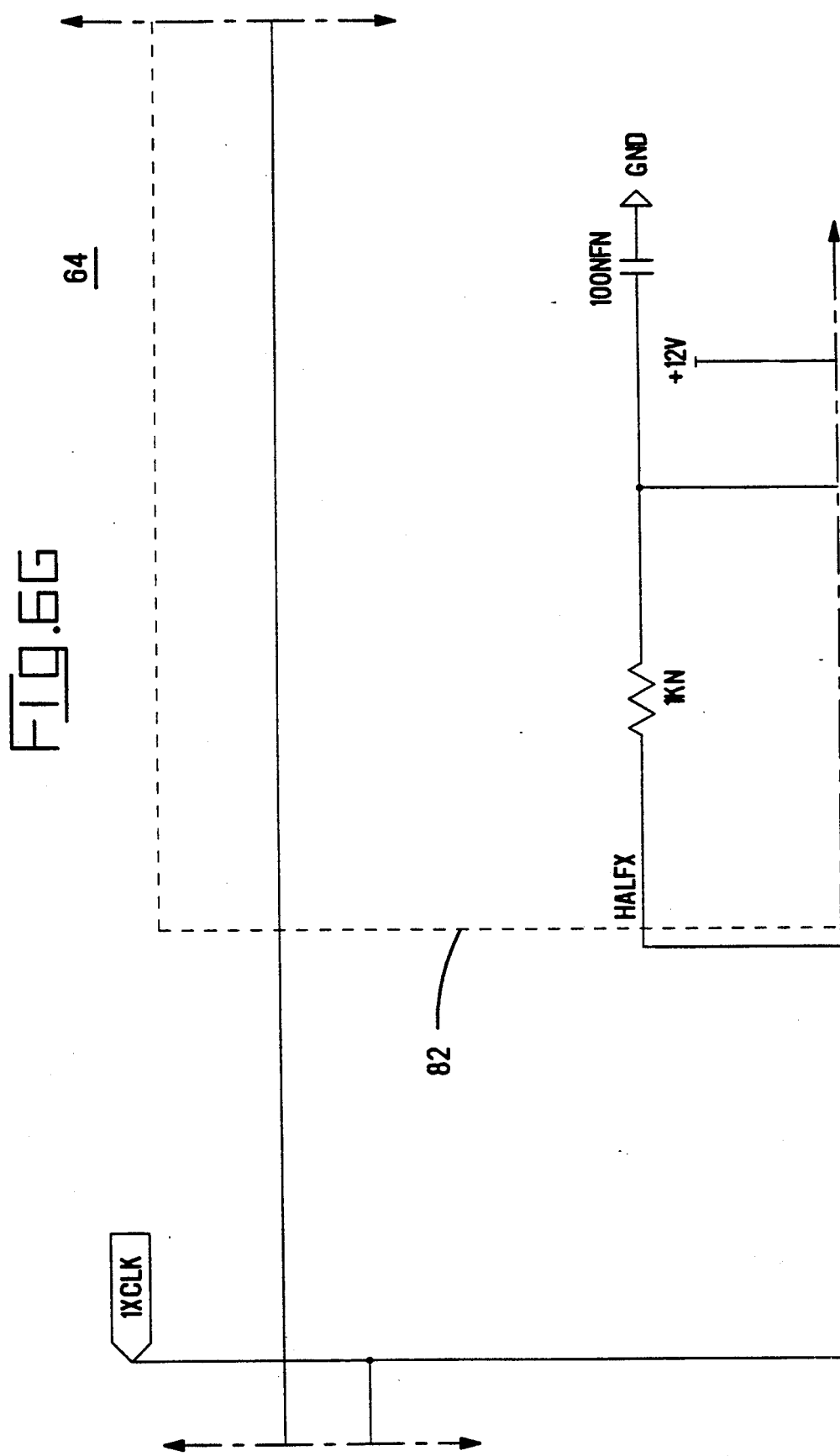

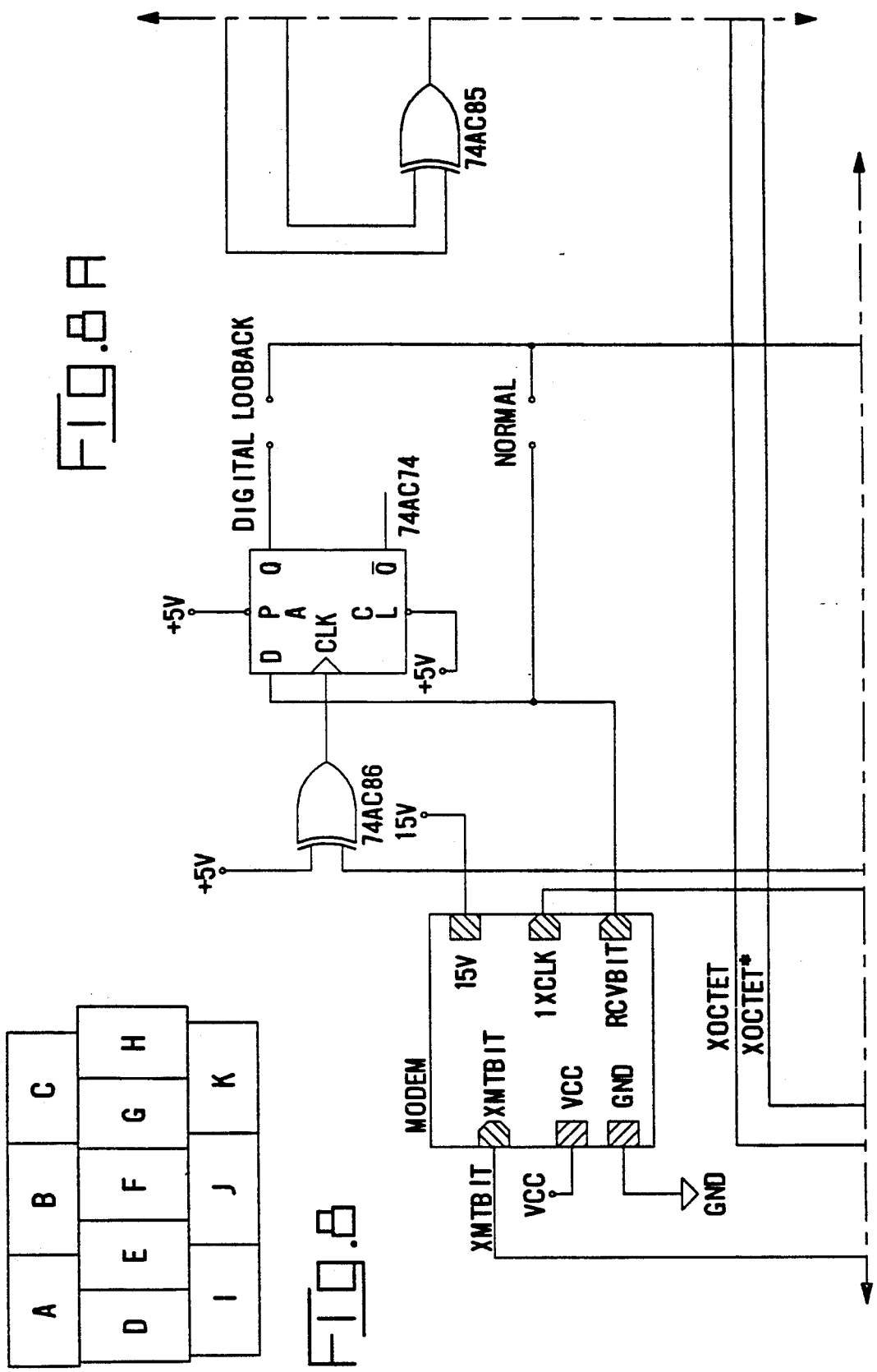

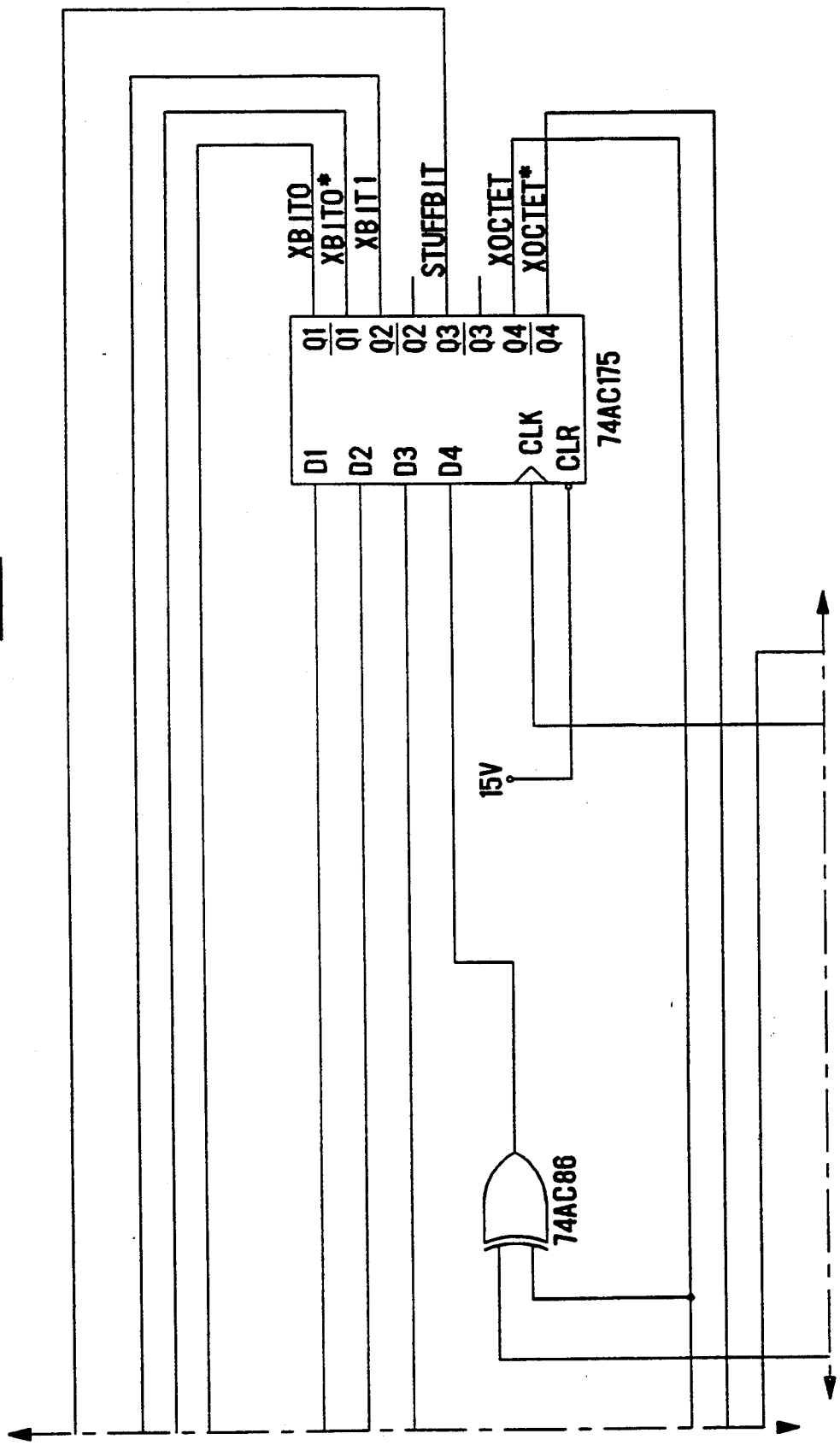

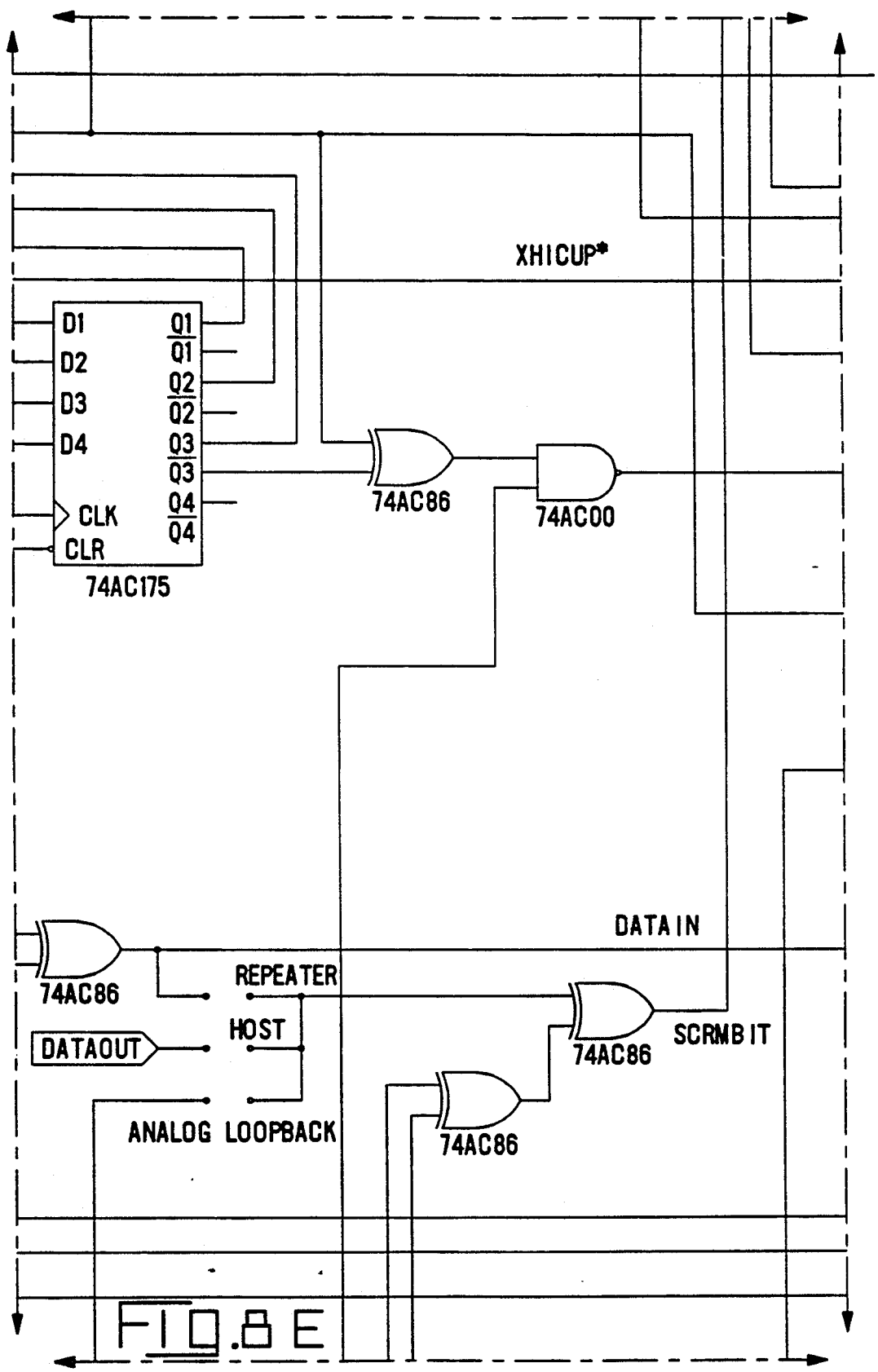

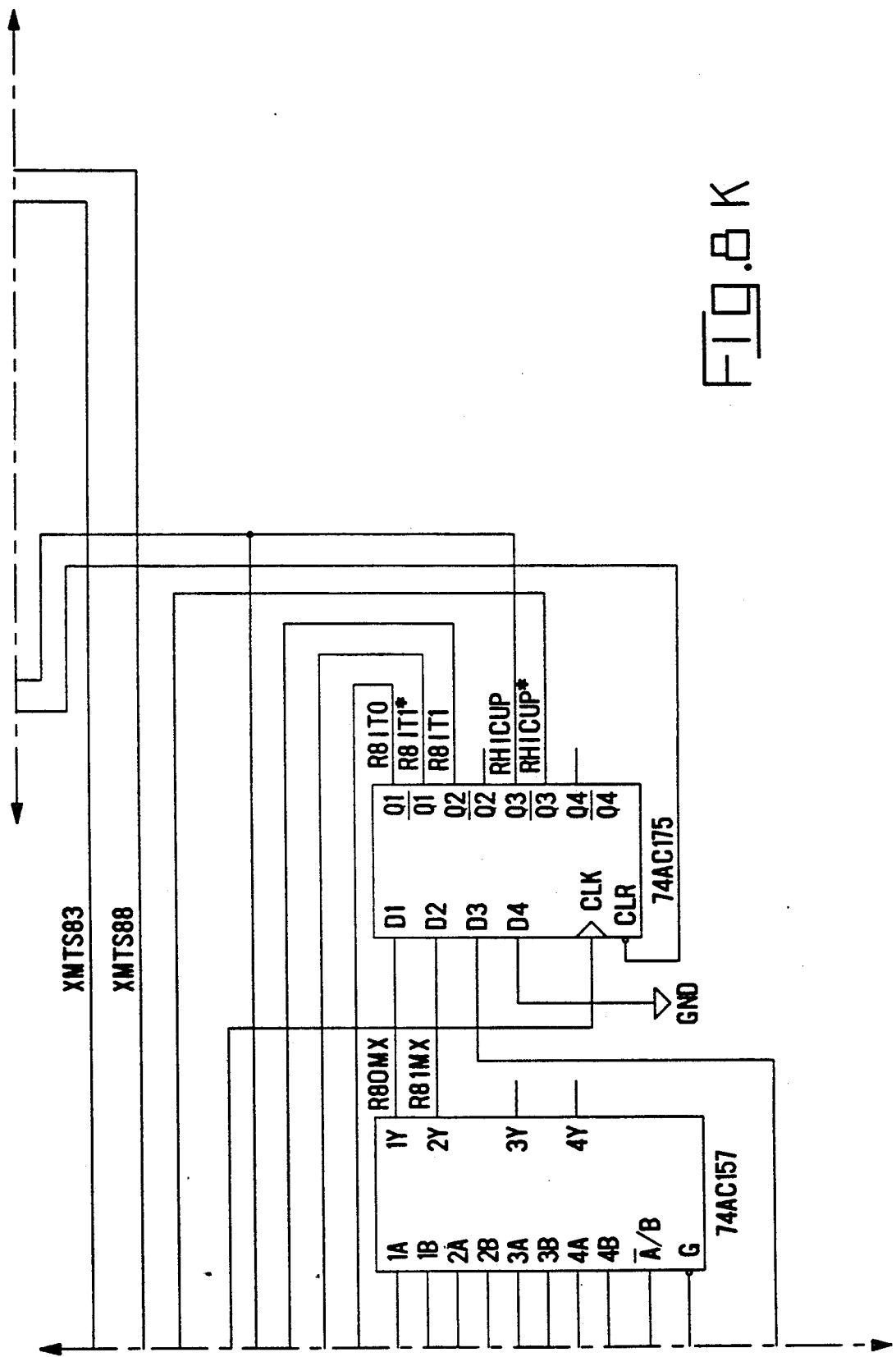

DIGITAL DATA TRANSMISSION SYSTEM WITH ADAPTIVE PREDISTORTION OF TRANSMITTED PULSES

CROSS REFERENCE TO RELATED APPLICATIONS

The present specification was filed on the same day as two related applications: U.S. patent application Ser. No. 07/632,433 filed Dec. 21, 1990, and U.S. patent application Ser. No. 07/431,825 filed Dec. 21, 1990, now U.S. Pat. No. 5,148,383. The entire specification of each of these related applications is hereby incorporated by reference into the present specification.

BACKGROUND OF THE INVENTION

This invention relates to a digital data transmission system of the type including a digital data transmitter connected to at least one receiver by a transmission medium, wherein the receiver is configured to receive a signal comprising a plurality of pulses, each characterized by a predetermined pulse shape.

Digital data transmission systems of the general type described above are in widespread use, for example as modems. Under certain circumstances, distortion of the transmitted signals by the metallic transmission medium may be a limiting factor. In particular, various frequency components of the transmitted signal will differ in propagation velocity, and the resulting dispersion of the transmitted signal causes a progressive alteration in pulse shape. This alteration of the transmitted pulse shape by the metallic transmission medium causes the pulse received by the receiver to differ from the predetermined pulse shape for which the receiver was designed to operate. This disparity can lead to transmission errors, and can limit either the maximum data transmission rate, the maximum range, or both.

There have been several attempts in the prior art to overcome this problem. For example, it has been suggested to provide an LC circuit on the output of the transmitter to alter the shape of the transmitted pulse before it is introduced onto the metallic transmission medium, and in this way to improve the correspondence between the pulse received by the receiver after distortion by the metallic transmission medium and the predetermined pulse shape. The publications of IEEE 802.3 10 Base T relate to one such modem using an LC circuit to predistort transmitted pulses.

Another approach is to process the received signal at the receiver in order to make it more nearly correspond to the predetermined pulse shape, a process known as receiver equalization. For many high speed data transmission systems adjacent transmitted pulses overlap in time, and this overlap may complicate the equalization of pulse shape at the receiver. It is an object of this invention to provide an improved apparatus for adaptively predistorting pulse shape at the transmitter, using digital techniques which can be implemented in a reliable, cost-effective manner, thereby increasing the maximum range and/or the maximum data rate of the system.

SUMMARY OF THE INVENTION

According to this invention, a digital data transmission system of the type described initially above comprises means for monitoring at least one transmission characteristic of the transmission medium, and means for automatically classifying the transmission medium into one of at least two categories in accordance with the monitored transmission characteristic. The transmitter includes means for transmitting on the transmission medium a data signal comprising a string of shaped transmitted pulses. The transmitter also includes means for selecting the shaped shaped transmitted pulses to one of a plurality of alternative pulse shapes, at least some of which deviate from the predetermined pulse shape in a manner effective to predistort the transmitted pulses to enhance correspondence between (1) the transmitted pulse as received by the receiver after distortion by the transmission medium and (2) the predetermined pulse shape. The selection of one of the plurality of alternative pulse shapes corresponds to the category in which the transmission medium is classified by the classifying means.

In high speed applications, adjacent transmitted pulses overlap in time, and the embodiment of this invention described below uses a digital transversal filter both to synthesize the overlapping transmitted pulses, and to predistort the transmitted pulses. This predistortion is selected to cause the transmitted pulse as actually received by the receiver (after distortion by the transmission medium) to correspond more closely to the predetermined pulse shape for which the receiver is designed. In this way, the data transmission rate and range can be increased without significant cost increases. This embodiment automatically monitors the gain selected by the automatic gain control (AGC) circuit as a measure of the line loss and therefore the length of the transmission medium. Then an appropriate predistortion for the transmitted pulse is selected based on the AGC gain in order to optimize the received pulse shape at the receiver.

BRIEF DESCRIPTION OF THE DRAWINGS

FIG. 1 is a block diagram of a digital data transmission system which incorporates a preferred embodiment of this invention;

FIG. 2 is a block diagram of one of the nodes of FIG. 1;

FIG. 3 is a block diagram of a transmitter included in the modem of FIG. 2;

FIG. 4 is a block diagram of a receiver included in the modem of FIG. 2;

DETAILED DESCRIPTION OF THE PRESENTLY PREFERRED EMBODIMENT

Figure 5A:
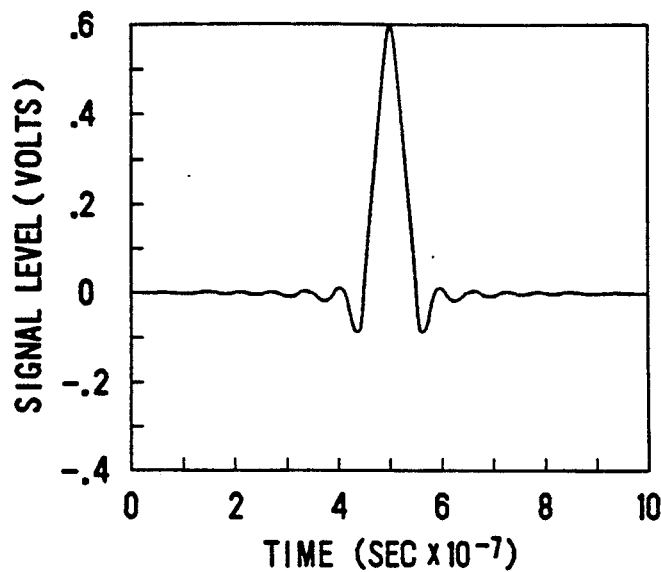
FIG. 5A is a waveform diagram showing the desired pulse shape for the receiver FIG. 4.

Turning now to the drawings, FIG. 1 shows a block diagram of a digital data transmission system having a plurality of nodes 12 interconnected by a metallic transmission medium 14. The metallic transmission medium 14 in this embodiment is a twisted pair cable of the type used in conventional telephone installations. Coaxial cable may be used in alternate embodiments.

FIG. 2 is a block diagram of one of the nodes 12, which includes an input terminal 16 that receives a binary data signal to be transmitted on the medium 14. This binary data signal is first scrambled in a data scrambler 18, which supplies a scrambled version of the binary data signal to a 4/5 block encoding circuit 20. The circuit 20 divides the scrambled data signal into groups of 4 bits, and adds a fifth bit selected such that there is always an even number of ones in each group of five bits. The block encoded signal is then applied as an input to a modem 22 which transmits the encoded signal as described below on the transmission medium 14.

As described below, the modem 22 also includes receiver circuitry coupled to the medium 14. Digital signals received by the modem 22 are processed by a 4/5 block decoding circuit 24 and a descrambler 26 to produce data and clock output signals on terminals 28 and 30. The circuits 18, 20, 24, and 26 are of a general type well known to those skilled in the art, and do not per se form part of this invention. FIGS. 8A through 8K provide detailed schematic diagrams of these elements.

FIG. 3 shows a block diagram of the transmitter 32 of the modem 22. By way of overview, the transmitter 32 uses an NRZST modulation (Non-Return to Zero with Smooth Transitions). This modulation is essentially a standard NRZ modulation where the transmitted pulse shape for a single isolated pulse covers two bit intervals and is preshaped in a specific way to cause smooth transitions. The transmitter 32 operates by transmitting a positive pulse for every binary 1 and a negative pulse for every binary 0. The data scrambler 18 minimizes the possibility of long sequences of certain data sequences which would hinder clock recovery. The 4/5 block encoding circuit 20 insures the presence of discrete spectral components at the block rate and its harmonics. Since one of these harmonics is the bit rate, the 4/5 block encoding circuit 20 simplifies clock recovery.

The transmitter 32 receives a string of bits to be transmitted at the input terminal XMTBIT. This string of bits is differentially encoded and phase-shifted in a circuit 34 that generates two output signals: ADATA and BDATA. ADATA and BDATA are identical except that BDATA is phase shifted by one quarter of a cycle as compared to ADATA. ADATA and BDATA are applied as data inputs to a digital transversal filter which in this embodiment comprises a pair of delay lines formed by shift registers 36, 38. Each of the shift registers 36, 38 is clocked by a respective clocking signal 2XCLK, 2XCLK* generated by a clock circuit 40. 2XCLK* is phase shifted by 180° with respect to 2XCLK, and has a frequency equal to twice the data clocking frequency of ADATA and BDATA. In general, the delay line clocking rate defined by the clock signals should be greater than the data clocking rate of ADATA and BDATA by a factor of N, where N is a positive integer power of 2. N is equal to 2 in this case. In this embodiment, each of the shift registers 36, 38 includes twelve stages, and the digital signals ADATA, BDATA are shifted progressively through the twelve stages of the shift registers 36, 38 at a rate determined by the clocking signals 2XCLK, 2XCILK*.

Each of the twelve stages of the shift registers 36, 38 has a respective output terminal, and these output terminals are connected in parallel to four data selectors 42a-42d, each of which has a respective enable terminal and 24 analog switching circuits. When any one of the data selectors 42a-42d is enabled, it switches the analog outputs from the shift registers 36, 38 to its respective outputs. Otherwise, the data selectors 42a-42d block the analog signals from the shift registers 36, 38 and present high impedance outputs.

Figure 6:
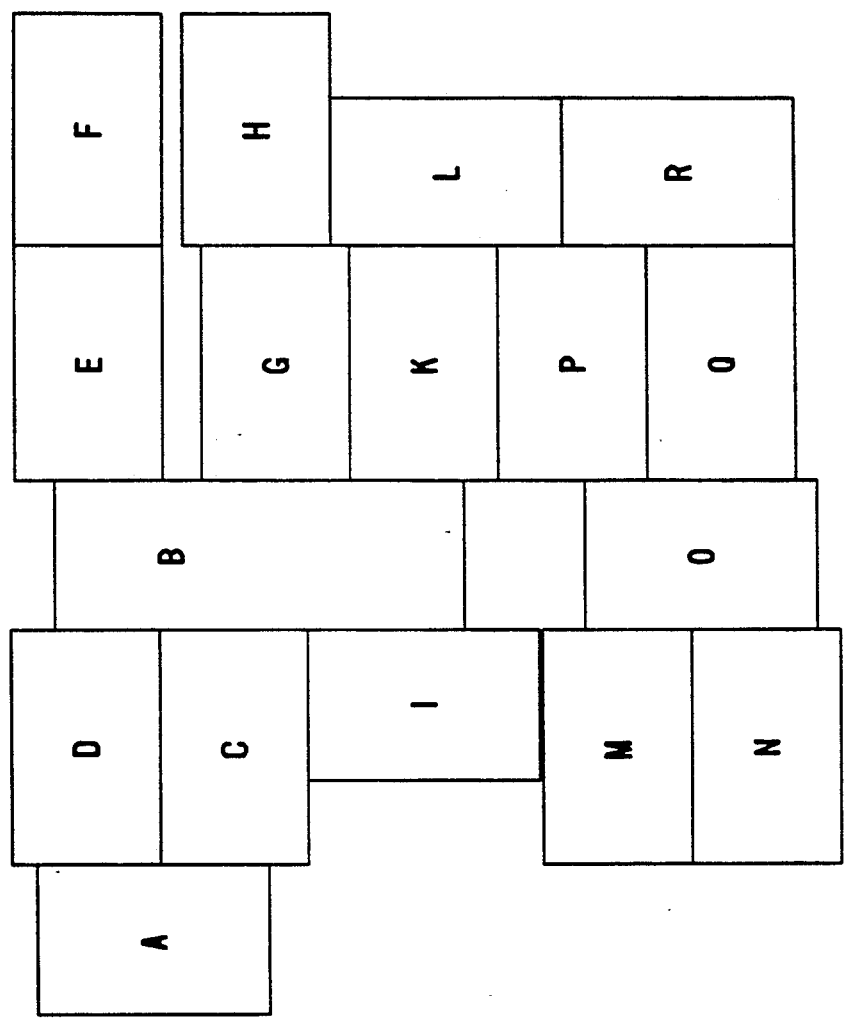
FIGS. 6A through 6R combine to form an electrical schematic diagram of the modem transmitter and receiver of FIGS. 3 and 4.

The 24 analog outputs of each of the data selectors 42a-42d are connected in parallel to a respective resistor bank 43a-43d. Each resistor bank 43a-43d includes up to 24 separate resistors, each connected to a respective one of the outputs of the respective data selector 42a-42d. Simply by way of illustration, one of the resistors is indicated by the reference numeral 60 in the resistor bank 43a of FIG. 6D. All of the resistors 60 of all of the resistor banks 43a-43d are connected in parallel to a summing node 46 which is in turn connected to a transmitter line driver 48.

The data selectors 42a-42d are controlled by a circuit which comprises an A-D converter 44 and a look up table or decoding device 45 such as a ROM, PROM or EPROM. The A-D converter 44 receives an analog input signal on line 47 from the automatic gain control (AGC) detector 72 described below. This signal is preferably the output of the AGC detector 72 that is applied to the AGC diodes 70 as discussed below in conjunction with FIG. 4. This signal varies as a function of the voltage level of the signal received by the modem 22, and thus is an indirect measure of the length of the medium 14. The A-D convertor 44 digitizes the signal into a two bit digital representation, which is applied as an address signal to the decoding device 45. The decoding device 45 generates a four bit output that enables one of the four data selectors 42a-42d and disables the remaining data selectors 42a-42d, all in accordance with the output of the A-D convertor 44. Thus, a first range of values of the output signal of the AGC detector 72 will enable the data selector 42a and respective other ranges of values of the output signal of the AGC detector 72 will enable data selectors 42b, 42c and 42d, respectively.

In effect, the AGC detector 72 operates as a means for monitoring a transmission characteristic of the metallic transmission medium, namely the signal attenuation of the medium. The A-D convertor 44 functions as a means for automatically classifying the metallic transmission medium into one of four categories in accordance with the transmission characteristic monitored by the AGC detector 72. Of course, other circuits can be used to implement these monitoring and classifying functions. For example, a circuit can be provided for actually measuring the resistance of the metallic transmission medium in order to determine its length.

Once one of the data selectors 42a-42d has been enabled by the decoding device 45, the resistors 60 of the respective resistor bank 43a-43d are connected in parallel between the summing node 46 and the output terminals of the respective shift registers 36, 38. The signal synthesized at the summing node 46 includes components associated with various output stages of the shift registers 36, 38, weighted by weighting factors determined by the values of the resistors in the respective resistor bank 43a-43d. This synthesized signal at the summing node 46 is then applied as an input to the transmitter line driver 48, which generates transmitted pulses on the medium 14 in response thereto.

Figure 6A:
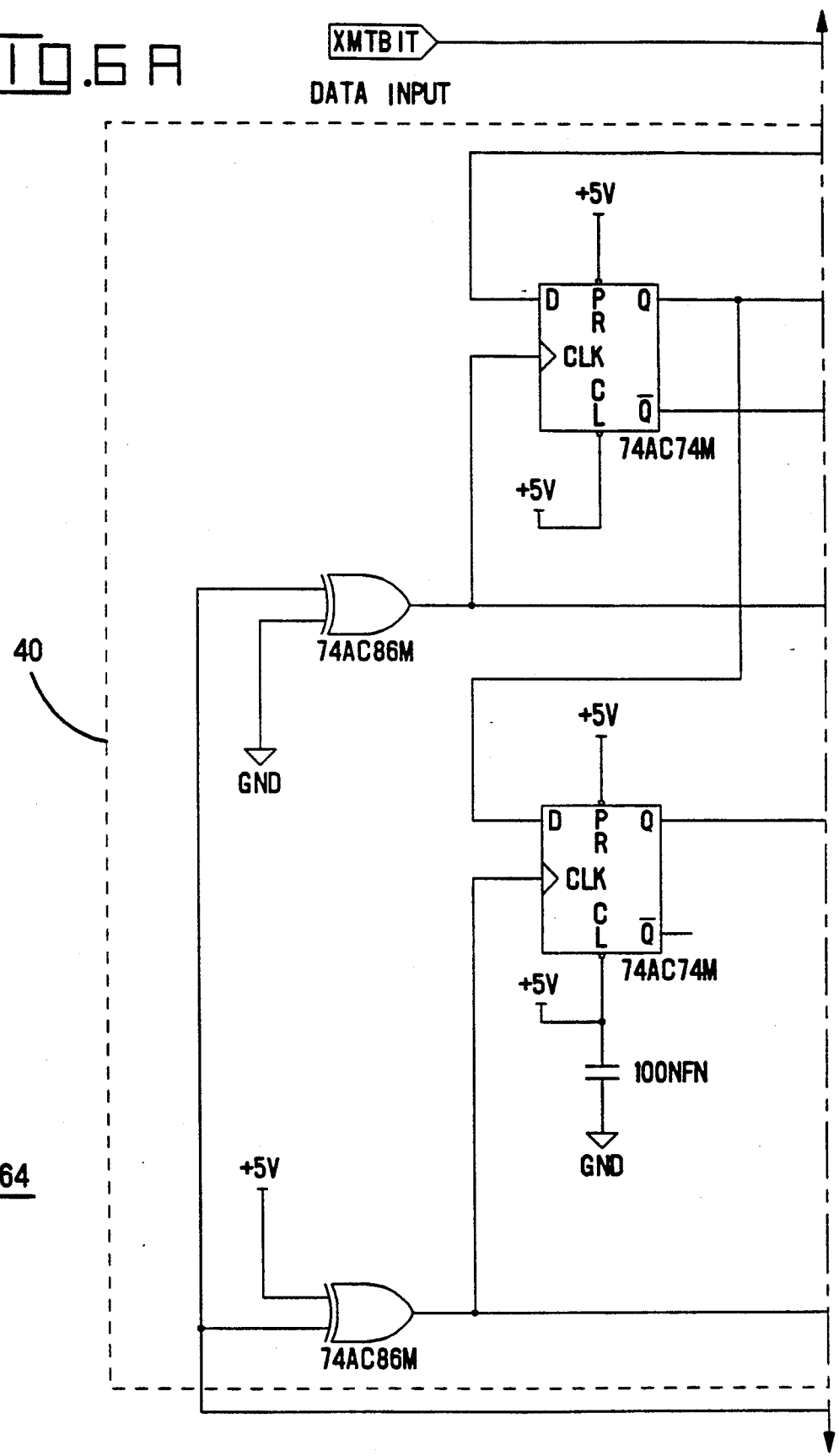
Figure 6B:
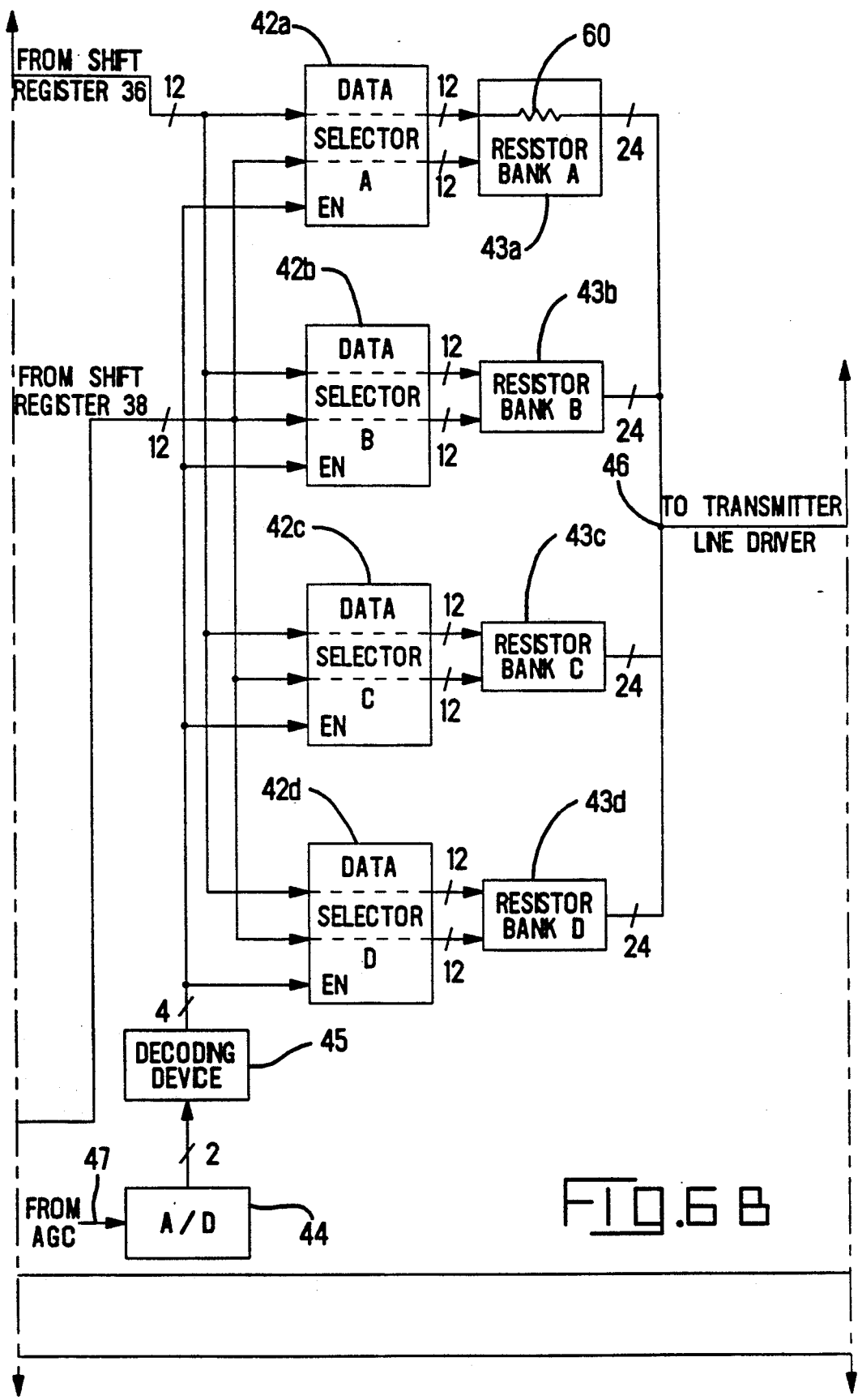
Figure 6C:
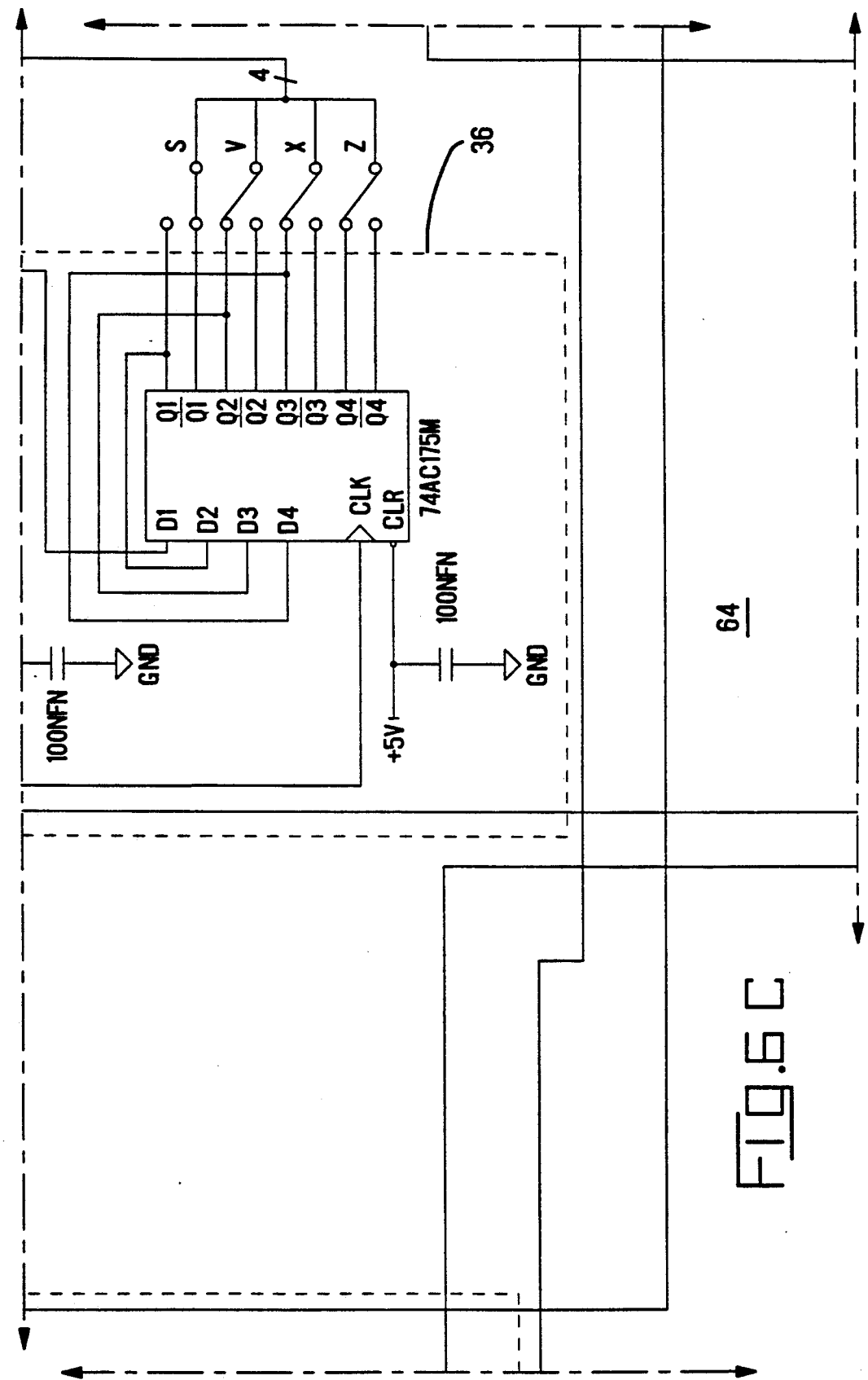
Figure 6E:
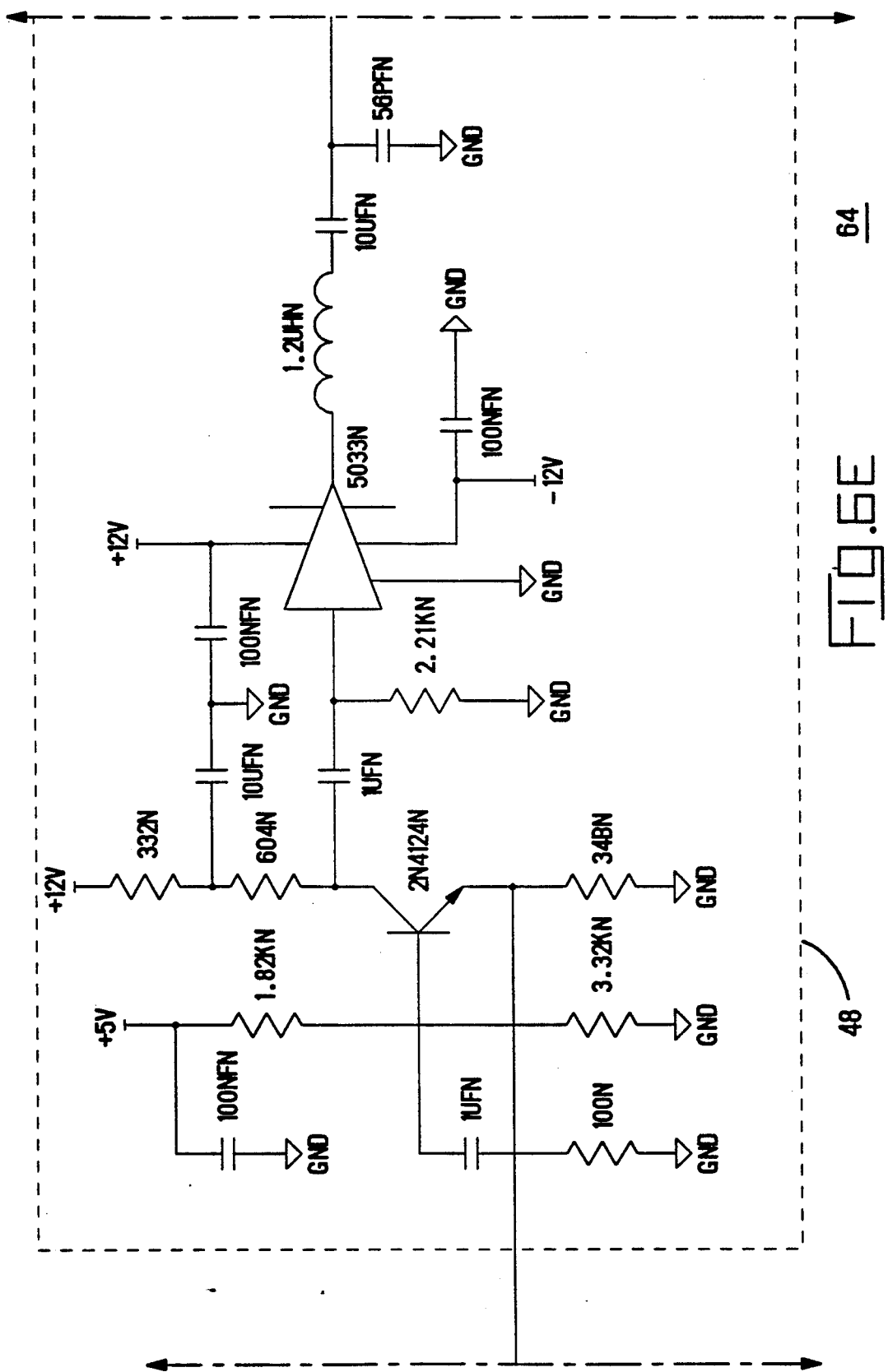
Figure 6H:
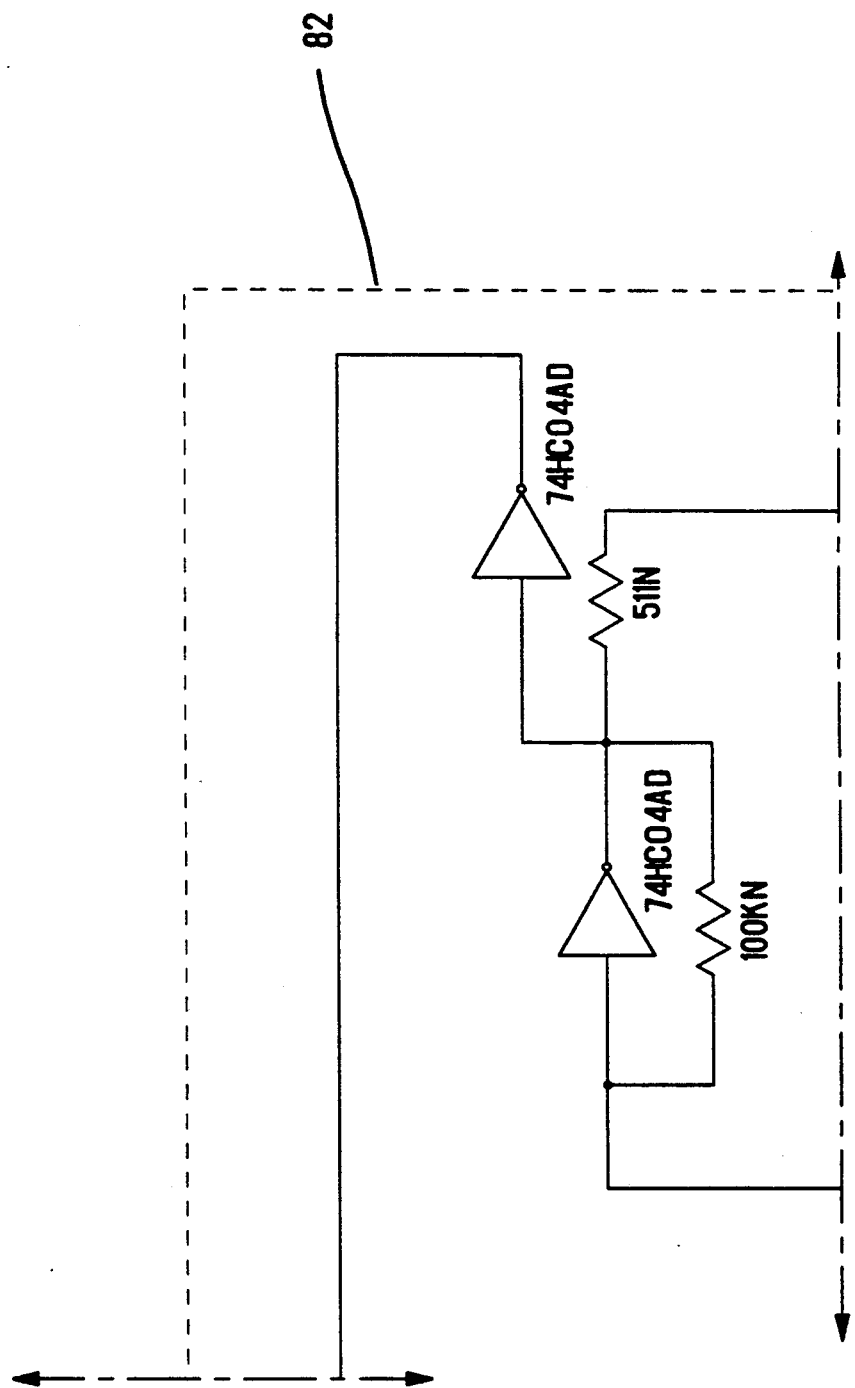
Figure 6:
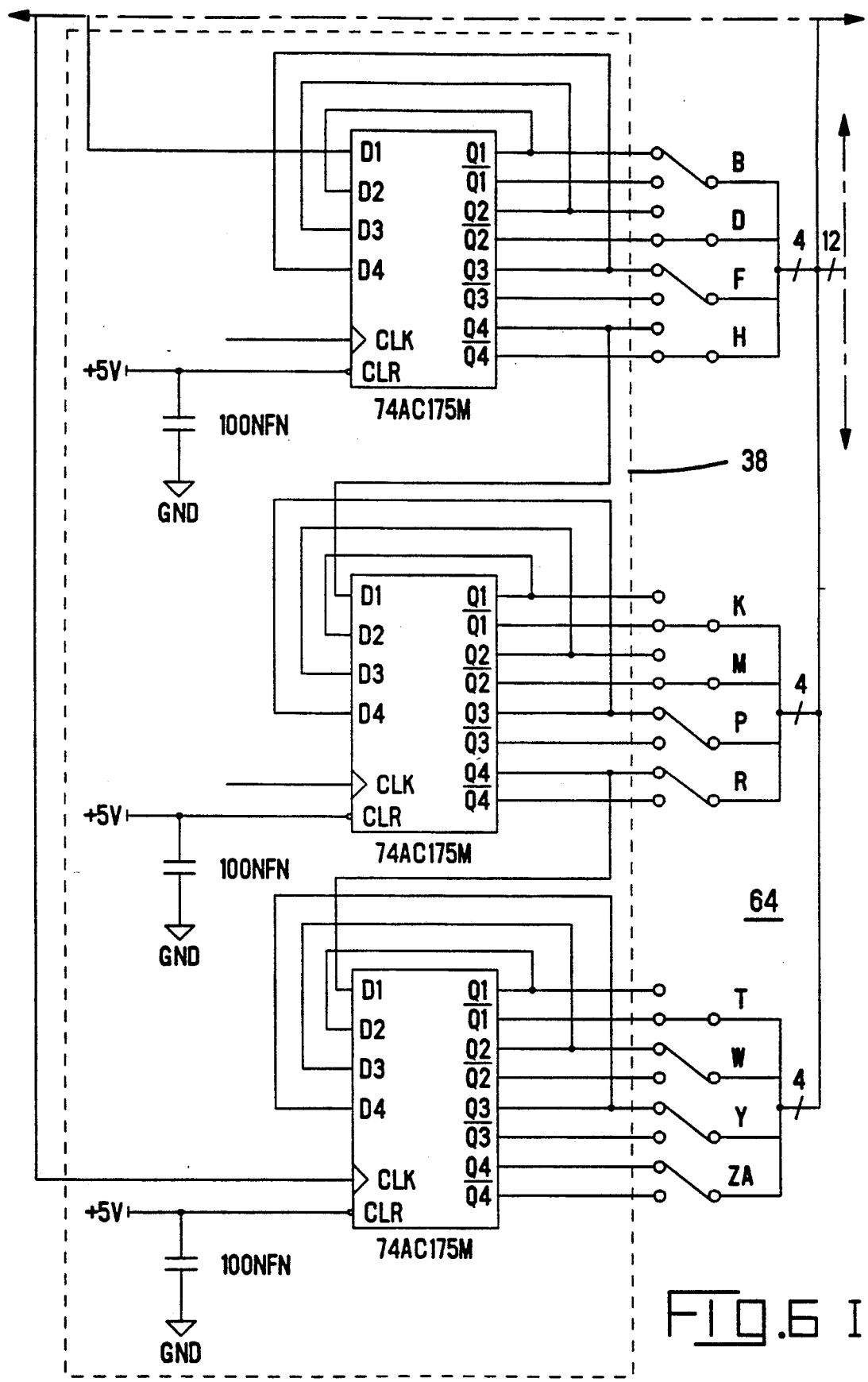
Figure 6K:
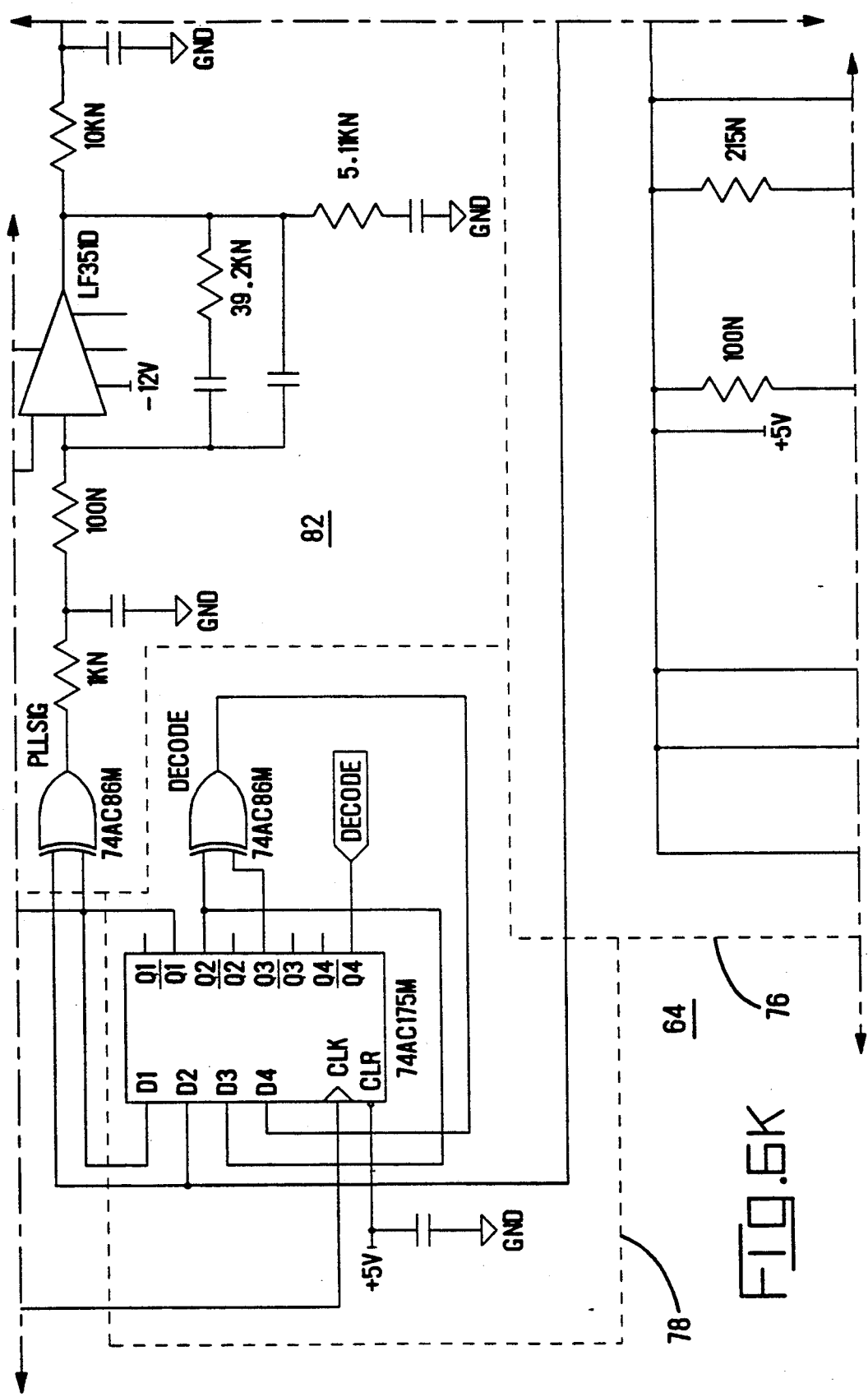
Figure 6L:
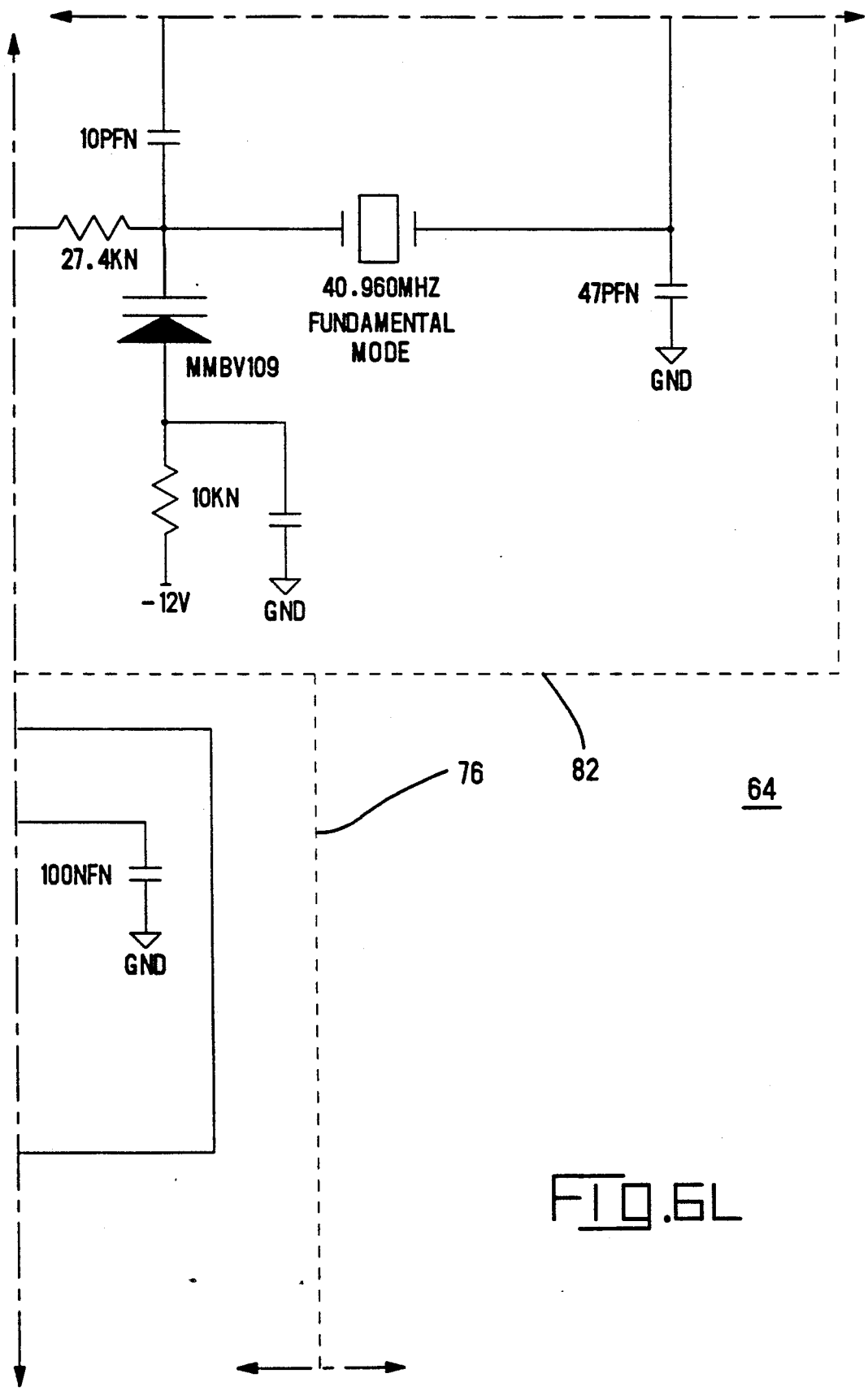
Figure 6M:
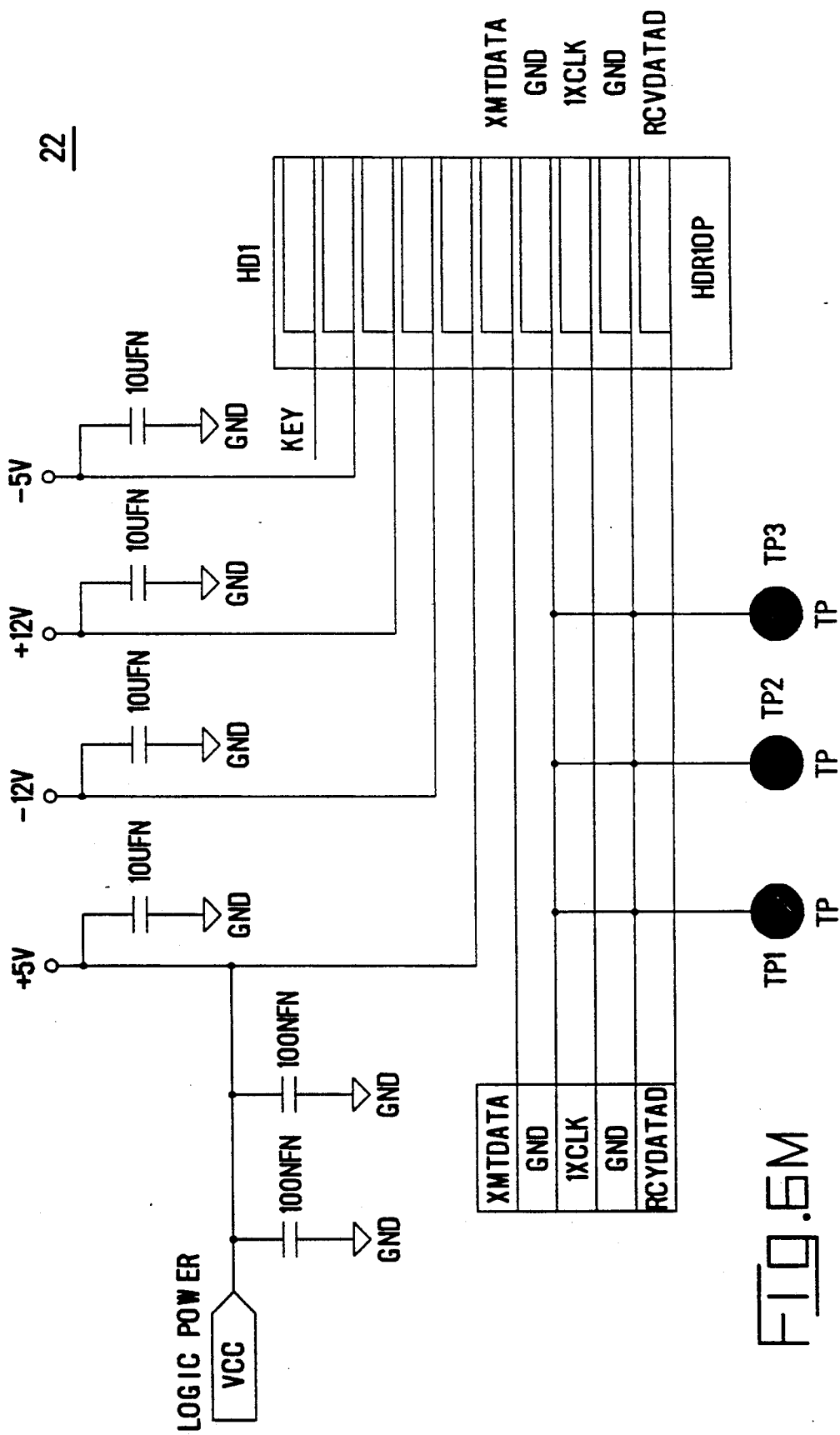
Figure 6N:
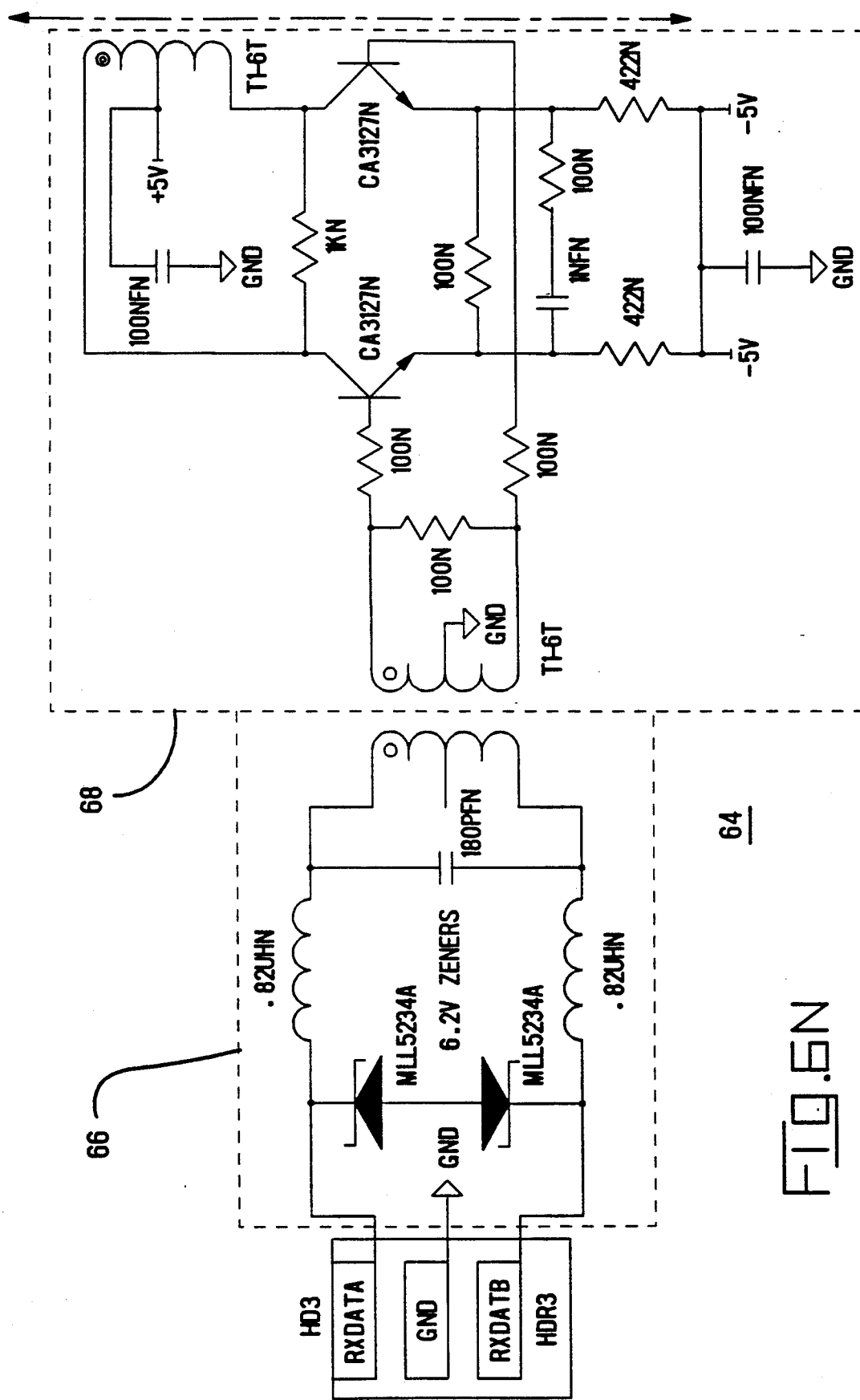
Figure 60:
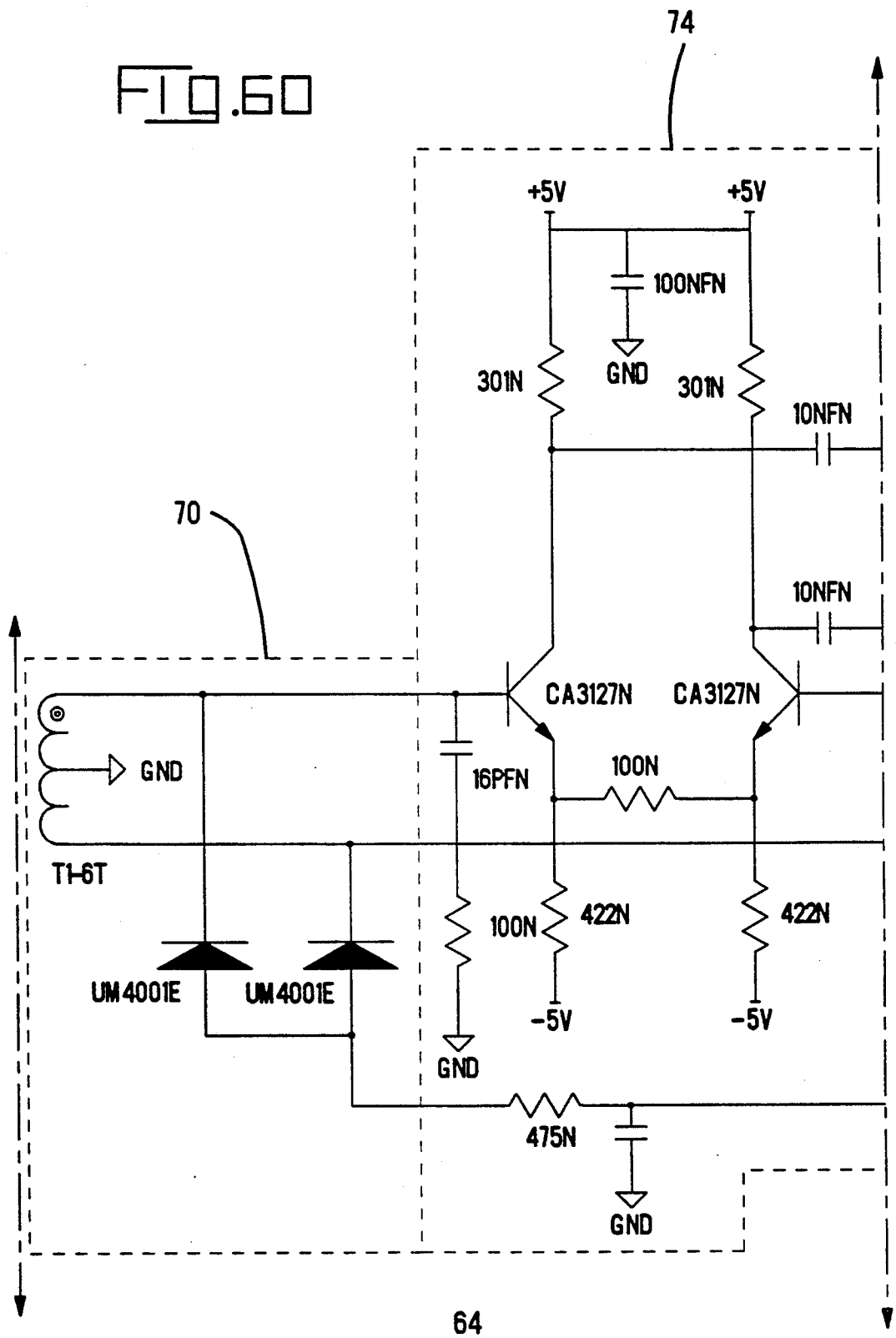
Figure 6P:
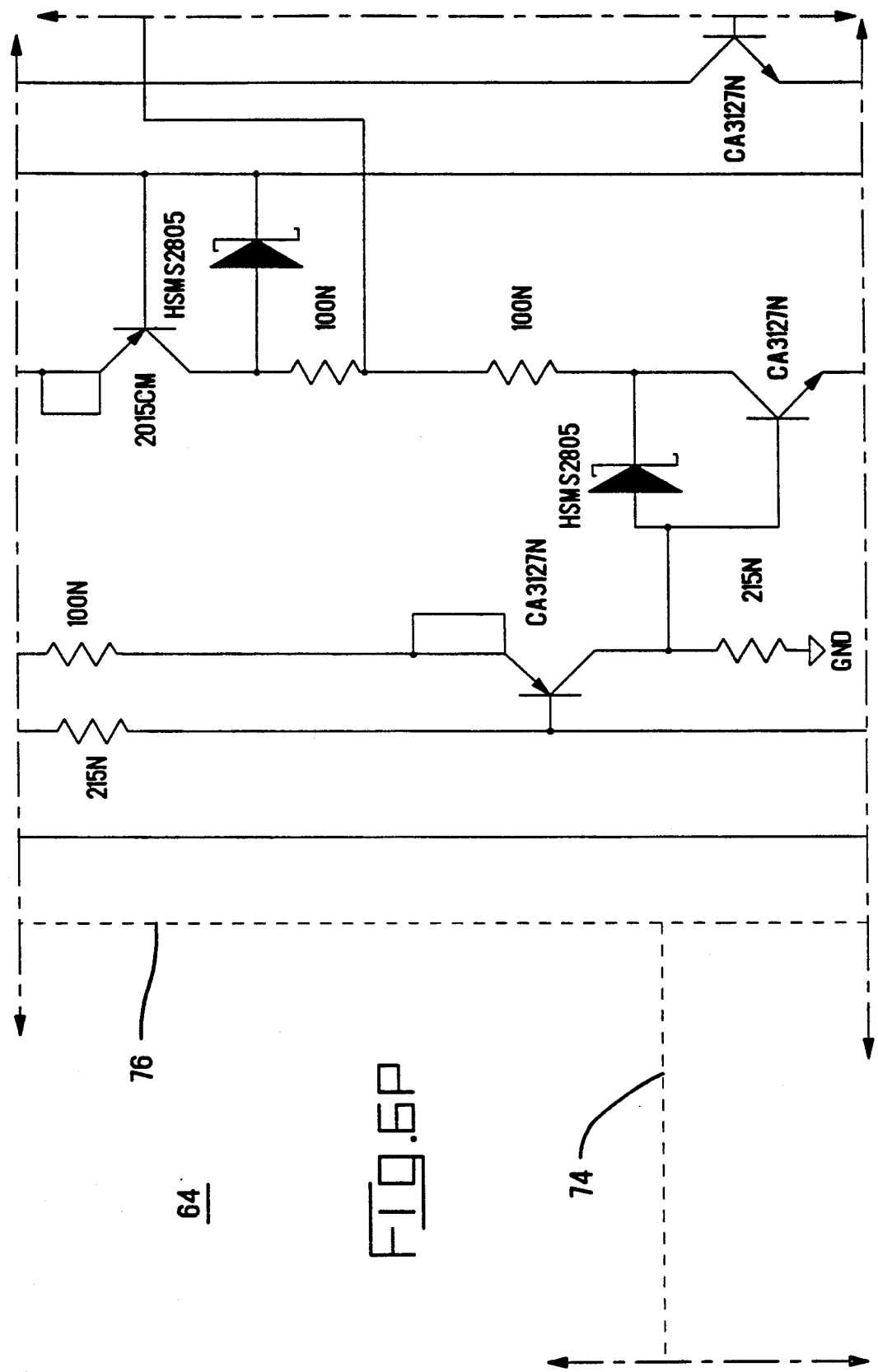
Figure 6Q:
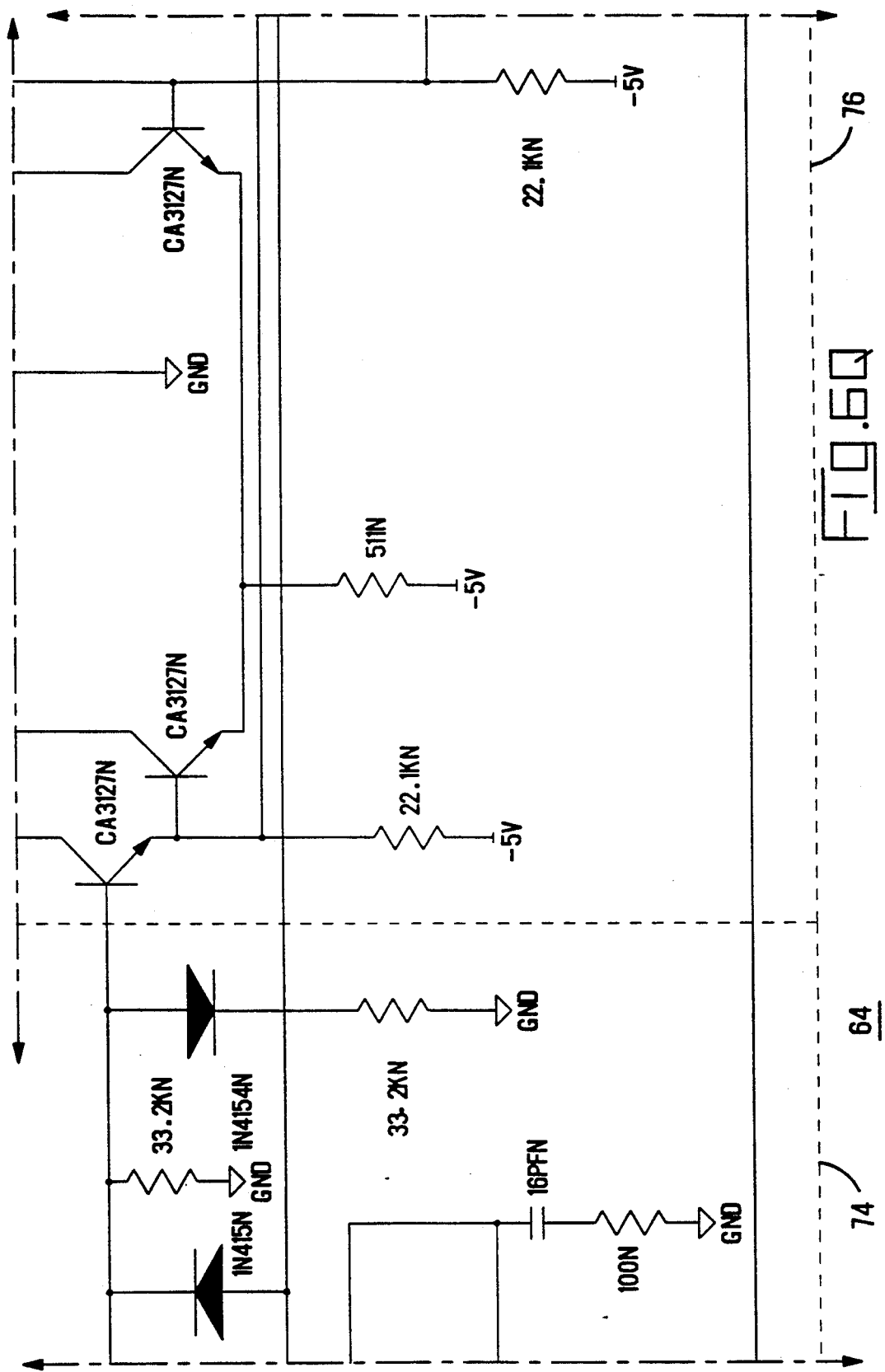
Figure 6R:
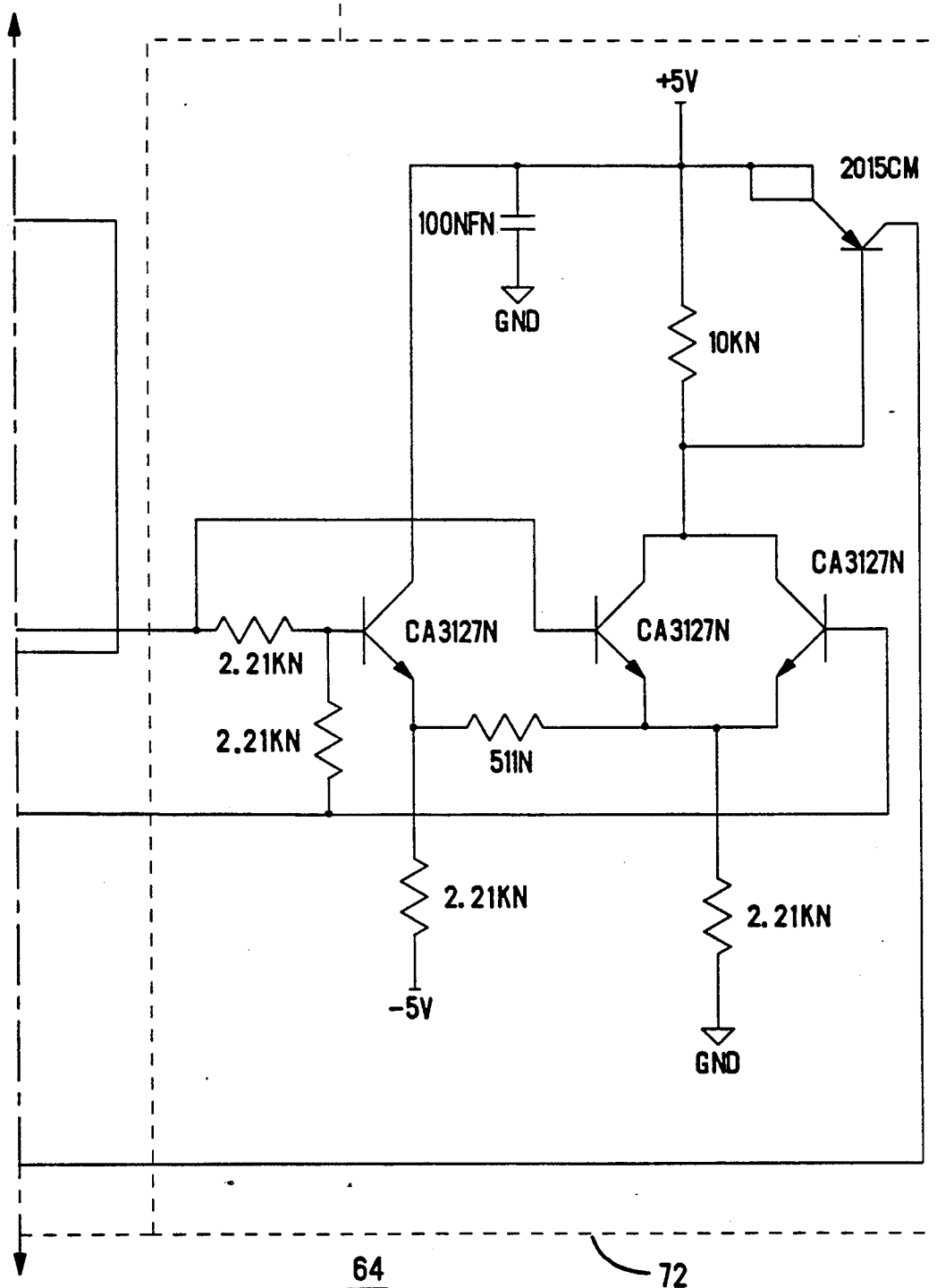
Figure 7A:
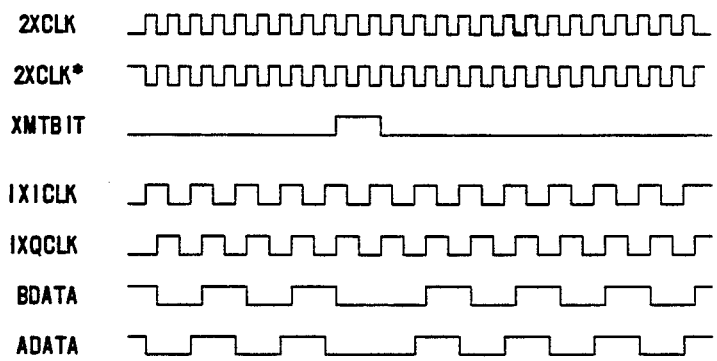
FIGS. 7A and 7B are timing diagrams illustrating operation of the modem of schematic 6a through 6e.
Figure 7B:
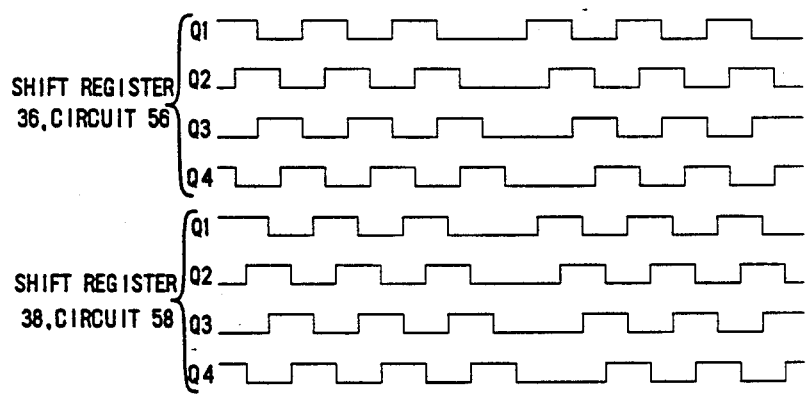
Figure 8B:
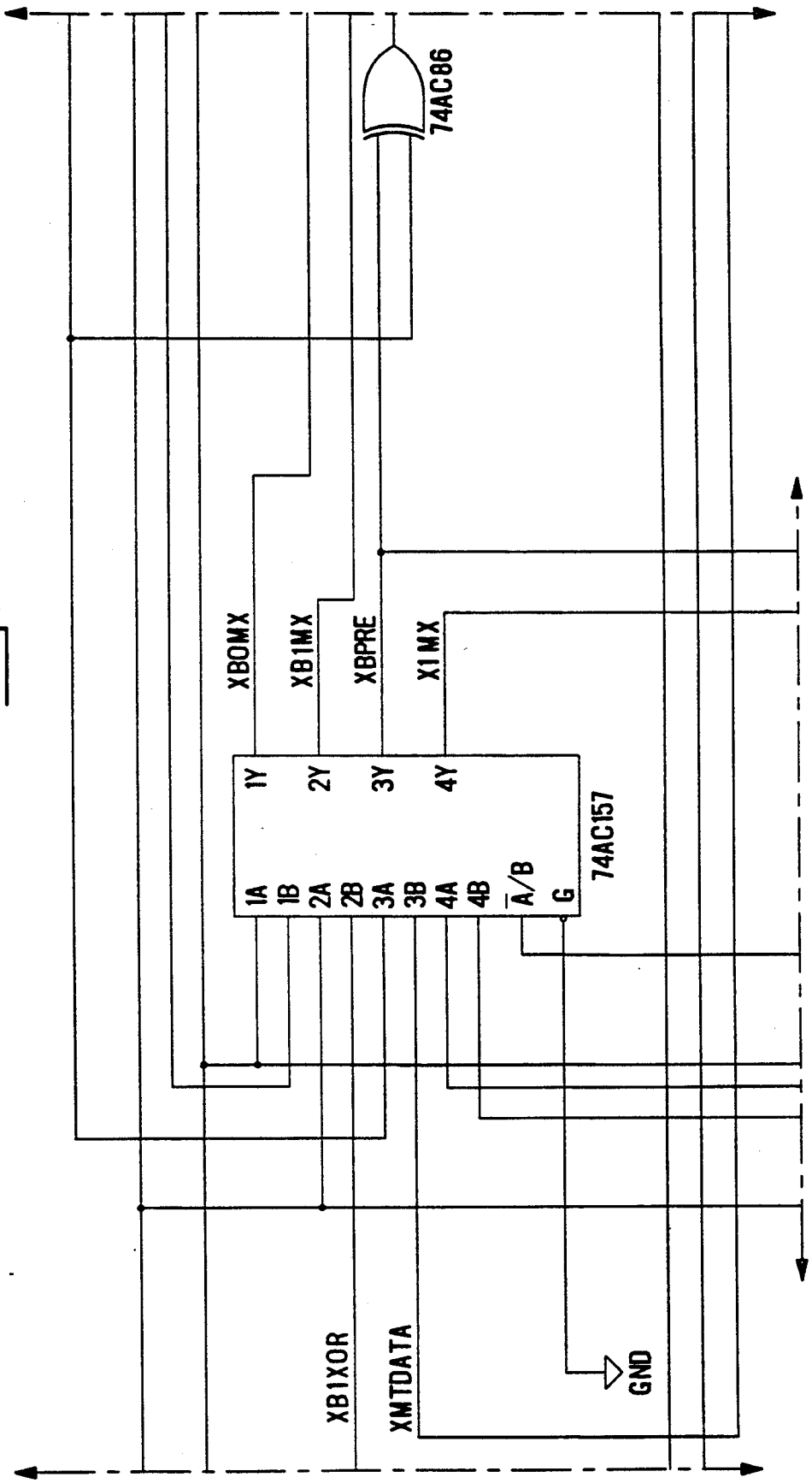
FIGS. 8A through 8K combine to form an electrical schematic diagram of the portions of the modem of FIG. 2 shown in FIGS. 6A through 6I and 6K through 6R.
Figure 8D:
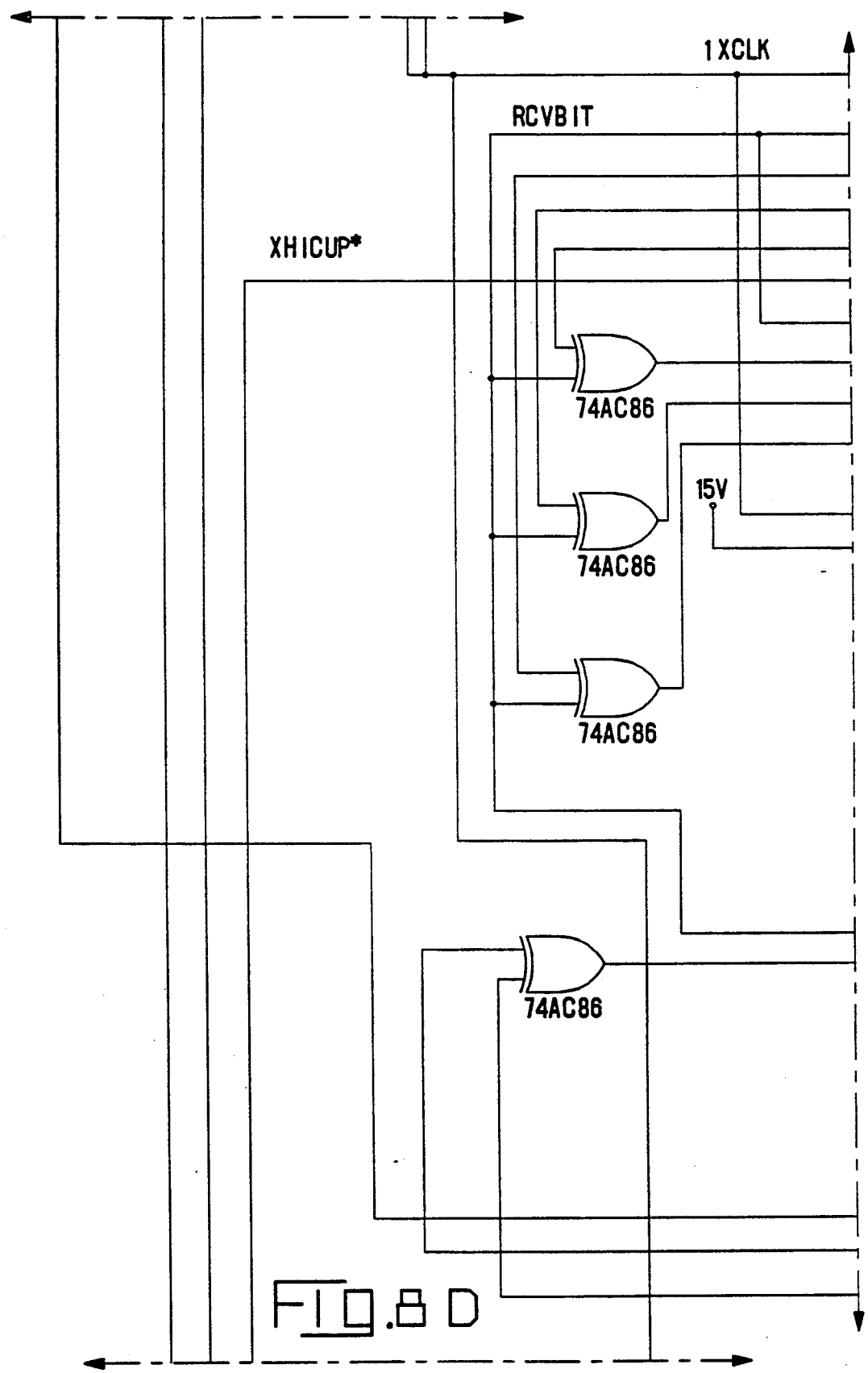
Figure 8F:
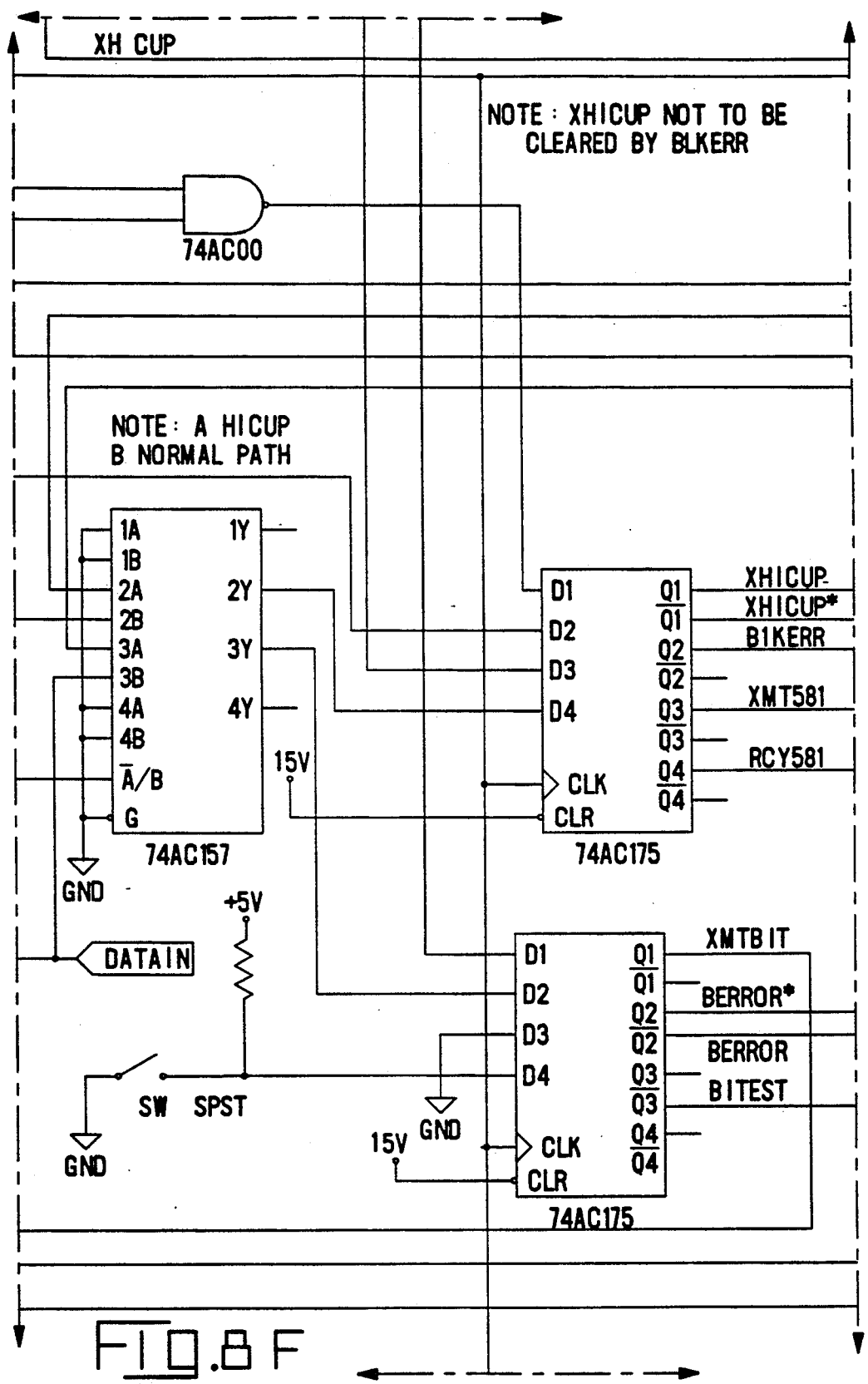
Figure 8G:
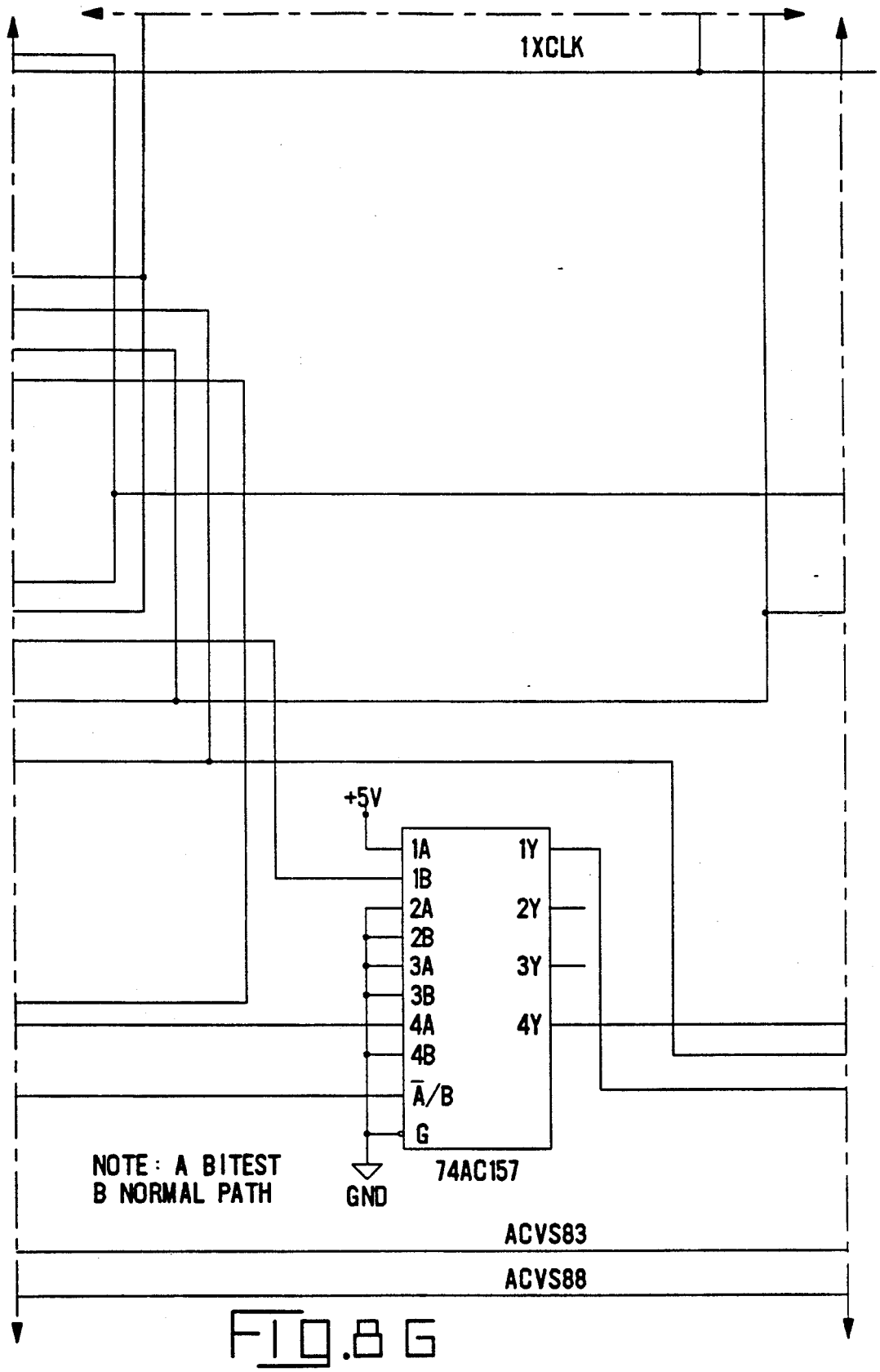
Figure 8H:
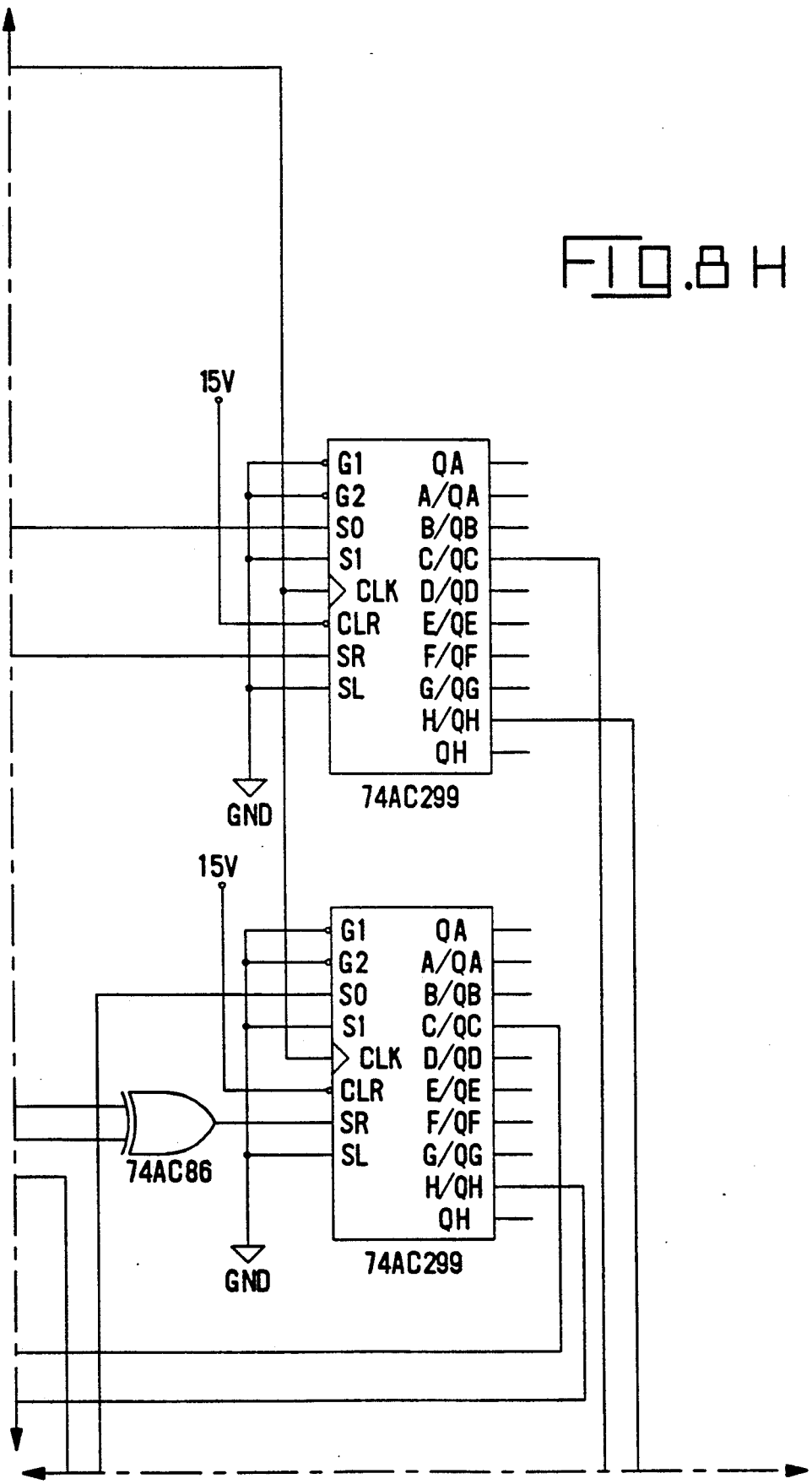
Figure 8:
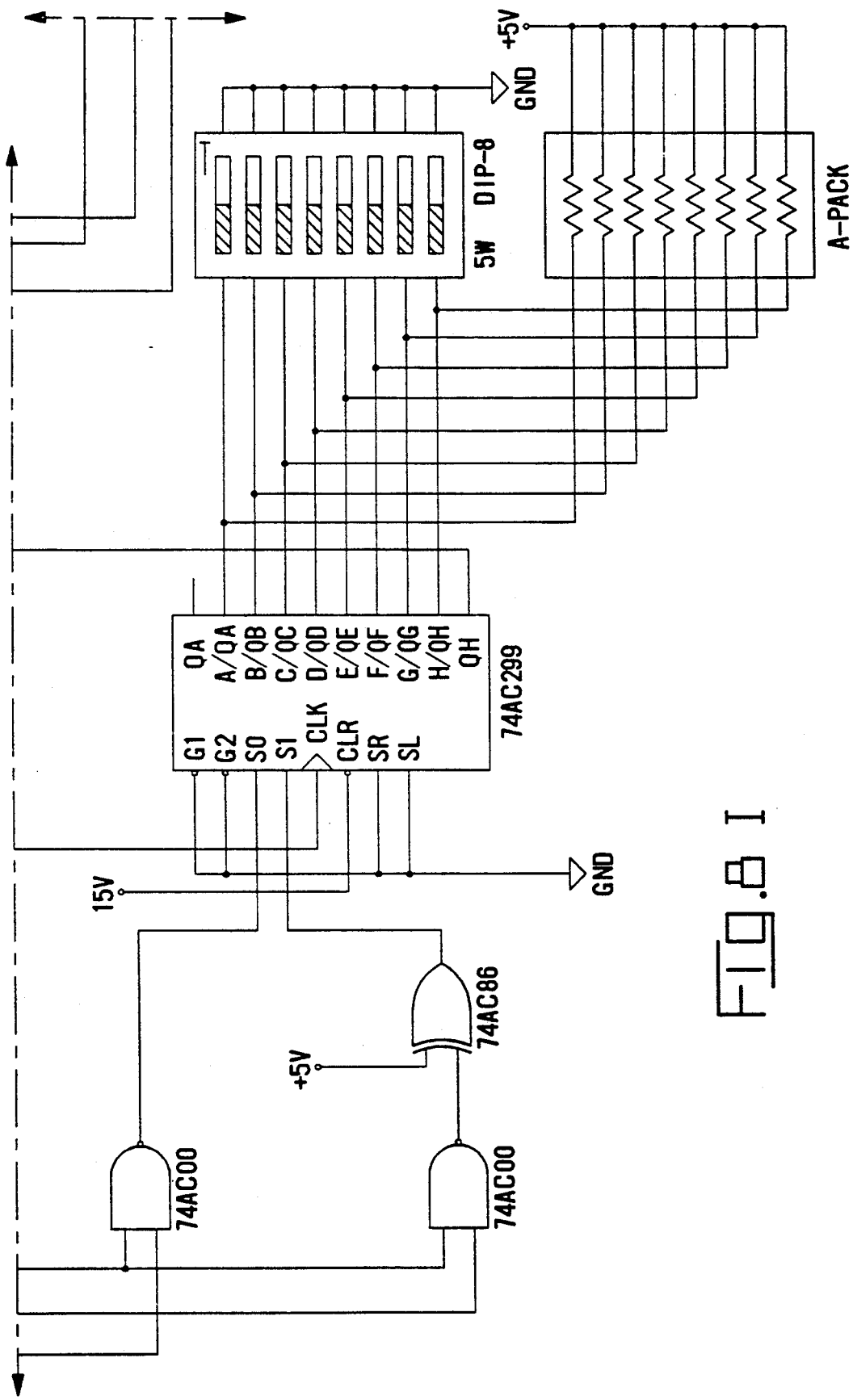
Figure 8J:
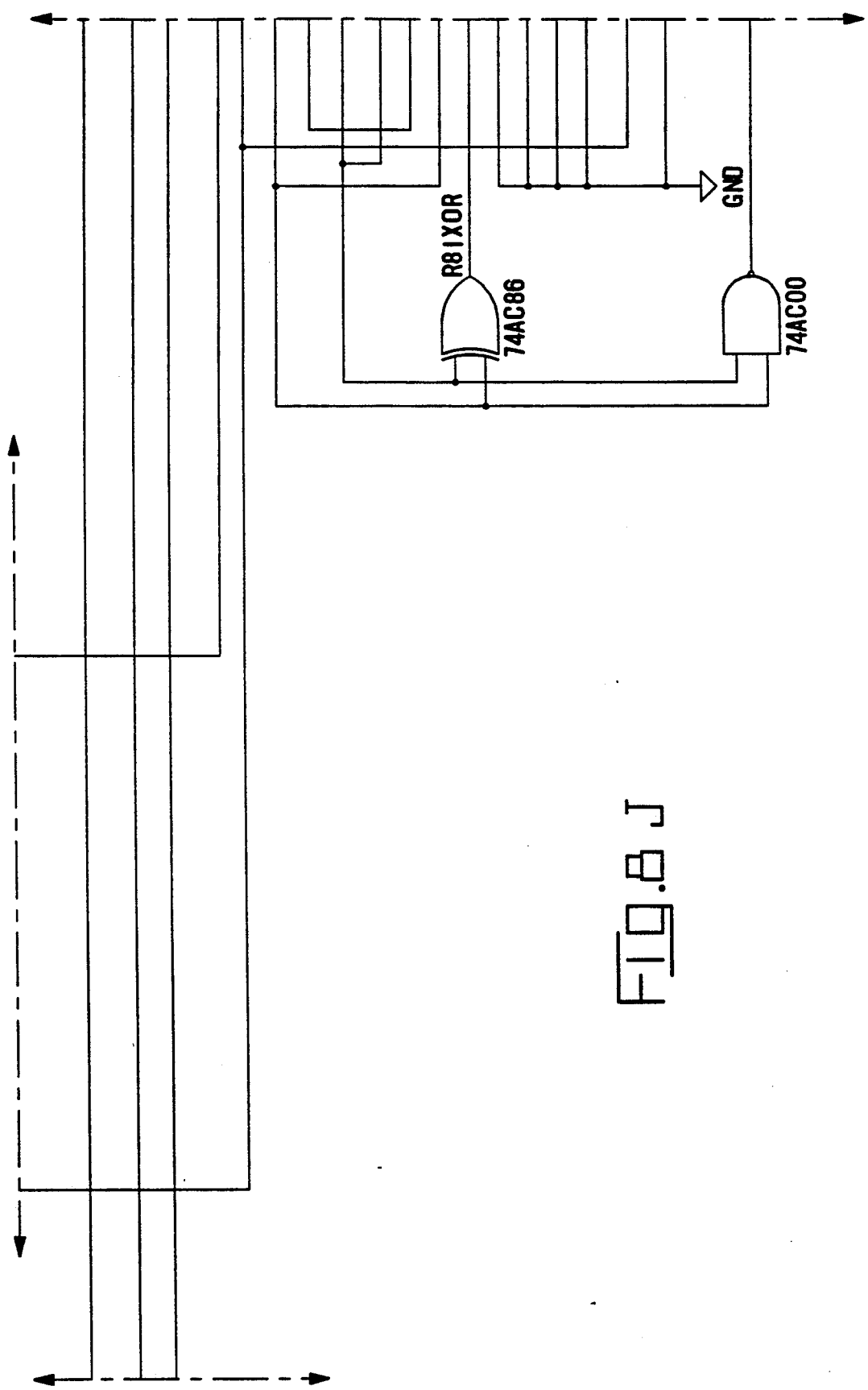

FIGS. 6A through 6R provide a detailed schematic diagram of the presently preferred embodiment of the transmitter 32, and FIGS. 7A and 7b provide timing diagrams for selected signals related to this schematic diagram.

Turning to these figures, the clock circuit 40 generates four clock signals 1XICLK, 1XQCLK, 2XCLK, 2XCLK*, as shown in FIG. 7A. 1XQCLK is phase-shifted by 90 degrees with respect to 1XICLK, and 2XCLK* is phase-shifted by 180 degrees with respect to 2XCLK. The frequencies of 1XICLK and 1XQCLK are identical; the frequencies of 2XCLK and 2XCLK* are identical; and the frequency of 2XCLK is twice that of 1XICLK. In this embodiment, the frequency of 2XCLK is 40.96 MHz.

The data input to the transmitter 32 is labeled XMTBIT in FIG. 6A. The rate at which bits are transmitted on the medium 14 for this particular embodiment is 20 MBS. The transmitted bits include the additional bits added by the 4/5 block encoding circuit 20, and the net throughput, or actual data rate without the block encoding bits, is 16 MBS.

The differential encoder and phase shifter 34 is implemented in FIG. 6B with an EXOR gate 50 and a pair of D flip-flops 52, 54. The EXOR gate 50 and the flip-flop 54 form a differential encoder, which further encodes the data so that a binary zero will be transmitted as a transition in the transmitted waveform and a binary 1 will be transmitted as a steady level, either high or low. The Q outputs of the flip-flops 52,54 are the binary signals ADATA and BDATA described above. As shown in FIG. 7A, these signals are identical to one another except that BDATA is delayed by one-quarter of a cycle with respect to ADATA. FIG. 7A shows the manner in which both ADATA and BDATA are differentially encoded as described above. In general, the phase delay between BDATA and ADATA should be 1/M of a cycle of the digital data signal, where M is a positive power of 2. In this embodiment, M equals 4.

The data signals ADATA and BDATA are applied to the shift registers 36, 38 respectively. These shift registers form a binary transversal filter which provides a digital means by which different complex analog pulse shapes may be synthesized by using a stair step approximation method. The shift registers 36, 38 are clocked by the clock signals 2XCLK and 2XCLK*, respectively, at twice the data rate of the data signals ADATA and BDATA.

FIG. 7B is a timing diagram showing the manner in which ADATA and BDATA of FIG. 7A are clocked through initial stages of the shift registers 36, 38, respectively. In particular, FIG. 7B shows the Q1, Q2, Q3 and Q4 outputs of the circuits 56, 58 of the shift registers 36, 38, respectively. The differential encoding of the transmitted data stream is clearly shown in FIG. 7B. When the combined result of both shift registers 36, 38 is considered, it is clear that there are a total of 24 representations of the data stream, each delayed from the previous one by one-fourth of the bit interval. Thus, the 24 stages of the shift registers 36, 38 when taken together represent a total of 6 bit cycles of the data stream being transmitted.

The outputs of the shift registers 36, 38 are connected to respective resistors 60 in the resistor banks 43a–43d. Both the Q and the Q-bar output terminals of the stages of the shift registers 36, 38 are available, and suitable jumpers 62 can be used to select either the Q or the Q-bar output of each stage for connection to the respective resistor 60.

The resistors 60 are interposed between the summing node 46 and the respective outputs of the shift registers 36, 38. In effect, the resistors 60 define weighting factors which determine the contribution of the respective stages of the shift registers 36, 38 to the composite synthesized signal generated at the summing node 46.

This composite signal is then applied as an input to the transmitter line driver 48. The transmitter line driver 48 includes a low pass filter, sometimes referred to as a splatter filter. The main purpose of this filter is to smooth out the steps in the staircase wave form generated at the summing node 46 so that the transmitted signal is smoother and more nearly continuous. This splatter filter also aids in attenuating the side lobes of the transmitted spectrum.

Table 1 defines the presently preferred values for the resistors 60 of the resistor banks 43a of this preferred embodiment.

TABLE 1

| Resistor No. | Resistance (ohms) |
|---|---|
| 1 | 100K |
| 2 | 4.75K |
| 3 | 2.67K |
| 4 | 7.50K |
| 5 | 20.0K |
| 6 | INF. |
| 7 | 49.9K |
| 8 | INF. |
| 9 | 30.1K |
| 10 | 18.2K |
| 11 | INF. |
| 12 | 3.32K |
| 13 | 2.37 |
| 14 | 5.11K |
| 15 | 10.0K |
| 16 | 16.2K |
| 17 | 8.25K |
| 18 | INF. |
| 19 | INF. |
| 20 | 12.1K |
| 21 | 22.1K |
| 22 | 7.50K |
| 23 | 49.9K |
| 24 | 3.92K |

Resistors 1–12 are connected to stages 1–12 of the shift register 36, respectively, and resistors 13–24 are connected to stages 1–12 of the shift register 38, respectively.

The resistor values of Table 1 have been selected to provide optimal predistortion for a medium 14 comprising approximately 400 feet of twisted pair cable. The remaining resistor banks 43b–43d preferably include resistors 60 selected to provide optimum predistortion for other line lengths. For example, resistor bank 43b may have resistors chosen to provide no predistortion for use with extremely short lengths of the medium 14. The resistor bank 43c may have resistors 60 selected for predistortion of a longer length medium 60, such as 800 feet, and the resistor bank 43d may be provided with resistors 60 selected for optimum predistortion for a line length that is even longer, as for example 1200 feet.

FIG. 4 shows a block diagram of the receiver 64 of the modem 22. As shown in FIG. 4, the receiver 64 is coupled to the transmission medium 14 by an input filter 66 which can be considered part of the transmission medium 14 for purposes of analysis. At present, the input filter 66 is a differential, two pole, low pass filter provided to provide loose filtering of unwanted high frequency noise such as radio stations and other coupled sources. The input filter 66 should be adapted for the particular application. The filtered signal generated by the input filter 66 is applied to a preamplifier 68 which in this embodiment is a differential preamplifier used to increase the signal level to a convenient value for the rest of the receiver 64. Additionally, the preamplifier 68 acts as a buffer to ensure that a constant, AGC level independent, load is presented to the transmission medium 14 at all times. The preamplifier 68 preferably has a flat frequency response from DC to over 20 MHZ. The preamplified output of the preamplifier 68 is then attenuated by an AGC diode circuit 70 which attenuates the preamplified signal by an amount determined by an AGC detector 72. In this way, the amplitude of the signal applied to the amplifier and DC restoration circuit 74 is maintained substantially constant.

The amplifier and DC restoration circuit 74 includes a relatively low gain differential amplifier and a DC restoration circuit to restore the DC component of the received signal.

The output of the amplifier and DC restoration circuit 74 is applied to a differential comparator 76, which is essentially a high gain, wide band amplifier. The gain of the comparator is sufficiently high to cause considerable clipping of both peaks of the received signal. The output of the differential comparator is a logic level signal which is applied to a data decoder circuit 78. The data decoder 78 decodes the digital data in the received signal and generates an output signal RCVBIT which is shown in FIG. 2 as an input to the 4/5 block decoding circuit 24. The data decoder 78 reverses the differential encoding performed by the differential encoder and phase shifter 34.

The AGC detector 72 is a full wave, low level transistor detector having an AGC detection level set at a value which is slightly less than one base-emitter voltage drop above the quiescent operating point.

The clock recovery circuit 82 includes a voltage controlled oscillator, an active loop filter, and a phase detector which cooperate to generate a signal at two times the frequency of the recovered data signal.

FIGS. 6A-6R provide a detailed schematic diagram of the presently preferred receiver 64.

OPERATION

The digital data transmission system 10 described above has been designed to optimize the transmitted pulse shape to maximize detectability at the receiver 64 after distortion by the transmission medium 14. The metallic transmission medium 14 distorts a transmitted pulse due to frequency dependent non uniformities of the medium in amplitude and propagation velocity. For a typical twisted pair, the impulse response of the medium 14, as measured with a narrow driving pulse, shows that the pulse energy is spread over five or more bit intervals at a line transmission rate of 20 MBS and distances of 400 feet or more. Furthermore, presently preferred spectrum efficient pulse shapes extend over multiple data clock cycles, and these two effects cause intersymbol interference which is compensated for by the system 10 to improve the maximum range and/or the maximum data transmission rate of the system.

The transmission system 10 uses resistor banks 43a-43d which have been designed to predistort the transmitted pulse in order to make it more nearly correspond to the desired pulse shape when received at the receiver 64 after distortion by the metallic transmission medium 14. It has been recognized that it is better and easier to compensate for the distortion of the transmission medium 14 at the transmitter, where the binary values for the preceding and following pulses are known absolutely, rather than at the receiver, where the data values must be deduced with a resulting greater possibility of error.

The receiver 64 is designed to receive a time compressed duobinary transmitted pulse given by the following equation:

$$H(t) = A(2T/3)^2 \sin(3\pi t/2T)/\pi t((2T/3) - t).$$

The compressed duobinary pulse shape is shown in FIG. 5A. The width of the main lobe of this pulse is spread over two bit intervals. Consecutive pulses of the same sign add to a near constant DC level provided the detail of the low amplitude parts of the pulse extending a few bit intervals before and after the main lobe are taken into account.

Figure 5B:
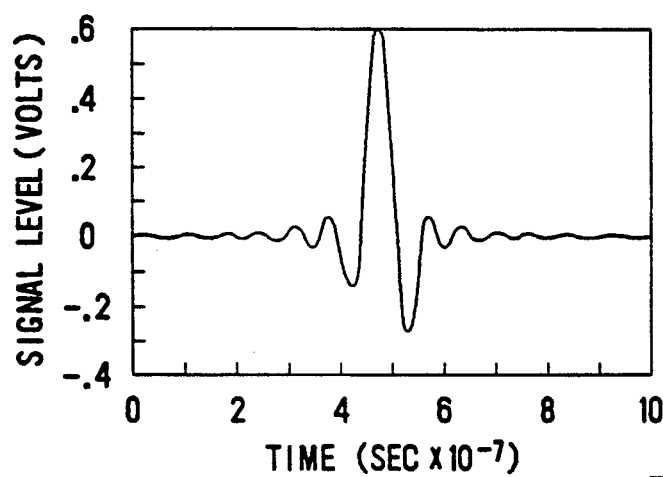
FIG. 5B is a waveform diagram showing the predistorted pulse shape transmitted by the transmitter of FIG. 3.

If the transmitter 32 were to transmit compressed duobinary pulses of the shape shown in FIG. 5A, distortion of the transmission medium 14 and the input filter 66 would cause the received pulse to depart significantly from the desired predetermined shape, at least in situations where the transmission medium 14 was of any significant length. In order to overcome this problem, the transmitter 32 transmits predistorted transmission pulses. The predistortion is selected such that the transmitted pulse shape, after passing through the distortion introduced by the transmission medium 14 and optionally the input filter 66, corresponds closely to the desired compressed duobinary pulse of FIG. 5A. FIG. 5B is a pulse waveform showing the ideal transmitted pulse shape for 400 feet of a twisted pair transmission medium 14 with only a low pass input filter 66 at the receiver 64. Note that the ideal transmitted pulse shape differs significantly from the compressed duobinary pulse of FIG. 5A.

Standard mathematical techniques can be used to determine the ideal transmitted pulse shape based on the known shape of the pulse optimally received by the receiver 64 and the transmission characteristics of the medium 14 and optionally the input filter 66. It is not difficult to determine the required transmitted pulse shape which will produce the ideal receiver pulse. The spectrum of the required transmitted pulse is determined by dividing the spectrum of the ideal receiver pulse by the spectral shape of the line and filters. The desired transmitted pulse shape is the inverse transform of the resultant spectrum. Further details are provided for example in IEEE Document 802.9-90/7, and in the texts referenced in that document.

Figure 5C:
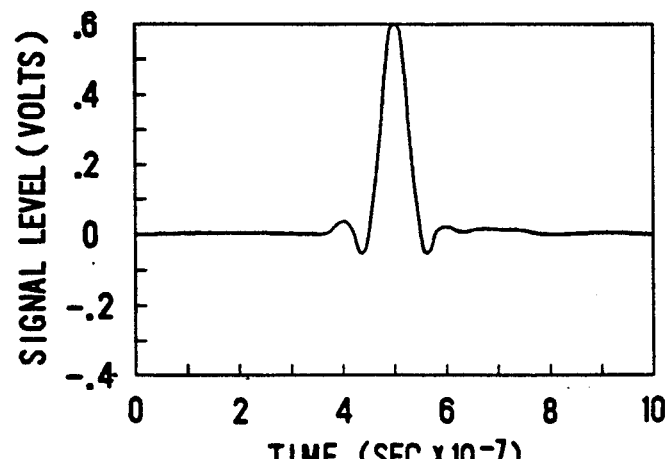
FIG. 5C is a waveform diagram showing the pulse shape received by the preamplifier of the receiver of FIG. 4.

FIG. 5C shows the resulting pulse shape as received by the preamplifier 68 after the ideal transmitted pulse shape of FIG. 5B is distorted by 400 feet of twisted pair transition medium 14 and the input filter 66. It should be noted that the resulting received pulse of FIG. 5C is a good approximation of the compressed duobinary pulse (which is the ideal received pulse for the receiver 64) of FIG. 5A.

In the digital data transmission system 10, the ideal transmitted pulse waveform of FIG. 5B is approximated by means of the shift registers 36, 38, the resistor banks 43a-43d, the summing node 46 and the transmitter line driver 48. The purpose of the shift registers 36, 38 is to provide the capability of switching various resistors of the resistor banks 43a-43d either high or low at quarter bit intervals. Once switched, the time interval that a particular resistor is held high or low is equal to one bit interval, and the pulses from the various resistors therefore overlap in time. Thus, as a bit in the ADATA and BDATA data streams is shifted through the shift register 36, 38, the bit switches the 24 resistors of one of the resistor banks 43a–43d either high or low, thereby providing either a positive or negative contribution to the synthesized signal generated at the summing node 46, with a weighting factor determined by the resistance of the respective resistor. As pointed out above, the shift registers 36, 38 are clocked 180° out of phase with a clocking frequency two times that of the data clocking frequency. Furthermore, BDATA is phase shifted by 90° with respect to ADATA. This causes a differentially encoded single bit from the input signal )DffBIT to ripple through the 24 output stages of the shift registers 36, 38 in the order indicated by the letters A–ZA of FIG. 6B, 6C and 6I. The weighting factors provided by the resistors 60 are selected to predistort the transmitted signal as described above to produce the ideal pulse shape at the receiver comparator.

Thus, the shift registers 36, 38 and resistor banks 43a–43d simultaneously perform two separate functions. First, they transform the squarewave ADATA, BDATA signals into complex analog waveforms having bits overlapping in time and smooth transitions well suited for transmission on the twisted pair transmission medium 14. Second, they predistort the shape of the transmitted pulses to correct for the distortion of the transmission medium 14 and optionally the input filter 66. The second, predistortion function is obtained merely by properly choosing the values of the resistors 60, without any significant increase in the cost or complexity of the transmitter 42.

The A-D convertor 44, decoding device 45 and data selectors 42a–42d automatically monitor the medium 14, classify the medium 14 into one of four categories, and select one of the four resistor banks 43a–43d in order to provide an optimal predistortion to the transmitted pulses. In effect, the transmitter 32 automatically adapts the predistortion of the transmitted pulses as appropriate for the particular medium 14 in use in an individual application. Thus, there is no need for the user to program the transmitter 32 with the length of the line 14. In this way, the automatic features of the transmitter 32 make it more easily used with greater reliability by relatively untrained personnel.

The shift registers 36, 38 form a delay line which cycles at 4 times the data bit rate, even though the clocking rate of the individual shift registers 36, 38 is only two times the data clocking rate. By eliminating the need for shift registers operating at a clocking rate of four times the data clocking rate, the choice of suitable circuitry is increased.

Further theoretical details regarding the design and operation of the digital data transmission system 10 are provided in the following documents, which are hereby incorporated into this specification by reference:

1. IEEE 802.9-90/7 "Theory and Practice of Non-Return to Zero Sinusoidal Transition Modulation with Line Compensation at the Transmitter", Jan. 11, 1990;
2. IEEE 802.9-90/8 "Offered Draft Text for Physical Medium Portion of 802.9 Standard Including 16 MBS on UTTP", Jan. 12, 1990;
3. IEEE 802.9-90/22 "Computer Analysis and Test Results of NRZST Impulse Noise and Crosstalk Rejection Characteristics", Mar. 8, 1990.

ALTERNATIVES

Though the system 10 represents the presently preferred embodiment, it should be apparent that a wide variety of changes and modifications to this preferred embodiment are possible. For example, it is not essential in all embodiments that the delay line which is implemented in the preferred embodiment by the shift registers 36, 34 be configured as shown. Alternately, a delay line of the type shown in Somer U.S. Pat. No. 4,773,082 may be substituted. Additionally, two shift registers are not always required, and in alternate embodiments one, two, four or more shift registers may be used. It is not essential that the delay line be formed as a digital shift register, and analog delay lines may be adapted for use with this invention. As pointed out above, the metallic transmission medium 14 is not limited to twisted pair cables, but can be implemented as other types of metallic transmission media (including coaxial cables) and nonmetallic transmission media (including optical and radio frequency media). Finally, in certain embodiments it may be preferable to predistort the transmitted pulses to take into account the medium 14 but not the filter 66. Also, predistortion may correct for signal altering effects of the splatter filter and other transmitter components such as the transformer and amplifiers. The analysis is not significantly changed, and the filter 66 (when present) can best be considered as part of the medium 14. The transmitted pulses need not overlap in time, and the optimum pulse shape is not limited to duobinary.

It is therefore intended that the foregoing detailed description be regarded as illustrative rather than limiting, and that it be understood that it is the following claims, including all equivalents, which are intended to define the scope of this invention.

What is claimed is:

1. In a digital data transmission system of the type comprising a digital data transmitter connected to at least one receiver by a metallic transmission medium, said receiver configured to receive a signal comprising a plurality of pulses, each characterized by a predetermined pulse shape, the improvement comprising:

means, associated with the transmitter, for monitoring a transmission characteristic of the medium and automatically classifying the metallic transmission medium into one of a plurality of categories in accordance with the monitored transmission characteristic;

means, included in the transmitter, for shaping a data signal comprising a string of pulses to one of a plurality of alternative pulse shapes, at least some of which deviate from the predetermined pulse shape in a manner effective to predistort the transmitted pulses to enhance correspondence between (1) the transmitted pulse as received by the receiver after distortion by the transmission medium and (2) the predetermined pulse shape;

means, responsive to the classifying means and connected to the shaping means, for automatically controlling the shaping mean to select one of the plurality of alternative pulse shapes to correspond to the category in which the transmission medium is classified by the classifying means; and means, included in the transmitter, for transmitting on the metallic transmission medium the data signal as shaped by the shaping means;

wherein the shaping means comprises:

a delay line having at least one data input terminal coupled to receive the data signal and a plurality of output terminals, said delay line operative to apply the data signal with a respective delay as a respective output signal at each of the output terminals of the delay line;

a plurality of banks of resistors, each resistor within a bank connectable to a respective one of the output terminals to weight the respective output signal by a respective weighting factor, each bank associated with a respective one of the alternate pulse shapes; and means for summing the weighted output signals to synthesize a summed output signal characterized by the selected one of the plurality of alternative pulse shapes.

2. The invention of claim 1 wherein the plurality of alternative pulse shapes comprises first and second alternative pulse shapes, and wherein the first and second alternative pulse shapes deviate from the predetermined pulse shape and from one another.

3. The invention of claim 1 wherein the monitoring means comprises an automatic gain control circuit coupled to the transmission medium.

4. The invention of claim 1 wherein the delay line comprises:

a digital transversal filter comprising at least one clock input terminal, and a plurality of stages which are clocked by signals applied to the clock input terminal to shift digital data through the stages, at least selected stages each providing a respective output; and a clock signal source connected to the clock input terminal to apply at least one clock signal thereto.

5. The invention of claim 1 wherein the summing means comprises a summing node connected to the plurality of resistors.

6. The invention of claim 1 wherein the automatically selecting means comprises means for selectively connecting any one of the banks of resistors to respective ones of the output terminals.

7. The invention of claim 1 wherein the transmission medium comprises a twisted pair of conductors.

8. The invention of claim 1 wherein the predetermined pulse shape is a compressed duobinary shape.

9. The invention of claim 1 wherein the transmitting means transmits the transmitted pulses at a rate in excess of 10 MBS.

10. In a digital data transmission system of the type comprising a digital data transmitter connected to at least one receiver by a metallic transmission medium, said receiver configured to receive a signal comprising a plurality of pulses, each characterized by a predetermined pulse shape, the improvement comprising:

a classification circuit associated with the transmitter, coupled to the metallic transmission medium and operative to monitor at least one transmission characteristic of the medium and to classify the medium into one of a plurality of categories in accordance with a monitored transmission characteristic of the medium;

a pulse shaping circuit, included in the transmitter, operative to shape a data signal comprising a string of pulses to one of a plurality of alternative pulse shapes, at least some of which deviate from the predetermined pulse shape in a manner effective to predistort the transmitted pulses to enhance correspondence between (1) the transmitted pulse as received by the receiver after distortion by the transmission medium and (2) the predetermined pulse shape;

a selection circuit responsive to the classification circuit and connected to the shaping circuit, to automatically control the shaping circuit to select one of the plurality of alternative pulse shapes to correspond to the category in which the transmission medium is classified by the classification circuit; and means, included in the transmitter, for transmitting on the metallic transmission medium the data signal as shaped by the shaping means;

wherein the pulse shaping circuit comprises:

a delay line having at least one data input terminal coupled to receive the data signal and a plurality of output terminals, said delay line operative to apply the data signal with a respective delay as a respective output signal at each of the output terminals of the delay line;

a plurality of banks of resistors, each resistor within a bank connectable to a respective one of the output terminals to weight the respective output signal by a respective weighting factor, each bank associated with a respective one of the alternate pulse shapes; and means for summing the weighted output signals to synthesize a summed output signal characterized by the selected one of the plurality of alternative pulse shapes.

11. The invention of claim 10 wherein the plurality of alternative pulse shapes comprises first and second alternative pulse shapes, and wherein the first and second alternative pulse shapes deviate from the predetermined pulse shape and from one another.

12. The invention of claim 10 wherein the classification circuit comprises an automatic gain control circuit coupled to the transmission medium.

13. The invention of claim 10 wherein the delay line comprises:

a digital transversal filter comprising at least one clock input terminal, ad a plurality of stages which are clocked by signals applied to the clock input terminal to shift digital data through the stages, at least selected stages each providing a respective output; and a clock signal source connected to the clock input terminal to apply at least one clock signal thereto.

14. The invention of claim 10 wherein the summing means comprises a summing node connected to the plurality of resistors.

15. The invention of claim 10 wherein the selection circuit comprises means for selectively connecting any one of the banks of resistors to respective ones of the output terminals.

16. The invention of claim 10 wherein the transmission medium comprises a twisted pair of conductors.

17. The invention of claim 10 wherein the predetermined pulse shape is a compressed duobinary shape.

18. The invention of claim 10 wherein the transmitter transmits the transmitted pulses at a rate in excess of 10 MBS.

19. The invention of claim 10 wherein the transmission medium comprises a metallic transmission medium.

20. In a digital data transmission system of the type comprising a digital data transmitter connected to at least one receiver by a metallic transmission medium, said receiver configured to receive a signal comprising a plurality of pulses, each characterized by a predetermined compressed duobinary pulse shape, the improvement comprising:

means, associated with the transmitter, for monitoring a transmission characteristic of the medium and automatically classifying the metallic transmission medium into one of a plurality of categories in accordance with the monitored transmission characteristic;

means, included in the transmitter, for shaping a data signal comprising a string of pulses to one of a plurality of alternative pulse shapes, at least some of which deviate from the predetermined compressed duobinary pulse shape in a manner effective to predistort the transmitted pulses to enhance correspondence between (1) the transmitted pulse as received by the receiver after distortion by the transmission medium and (2) the predetermined compressed duobinary pulse shape;

means, responsive to the classifying means and connected to the shaping means, for automatically controlling the shaping means to select one of the plurality of alternative pulse shapes to correspond to the category in which the transmission medium is classified by the classifying means; and means, included in the transmitter, for transmitting on the metallic transmission medium the data signal as shaped by the shaping means.

21. In a digital data transmission system of the type comprising a digital data transmitter connected to at least one receiver by a metallic transmission medium, said receiver configured to receive a signal comprising a plurality of pulses, each characterized by a predetermined pulse shape, the improvement comprising:

a classification circuit associated with the transmitter, coupled to the metallic transmission medium and operative to monitor at least one transmission characteristic of the medium and to classify the medium into one of a plurality of categories in accordance with a monitored transmission characteristic of the medium;

a pulse shaping circuit, included in the transmitter, operative to shape a data signal comprising a string of pulses to one of a plurality of alternative pulse shapes, at least some of which deviate from the predetermined pulse shape in a manner effective to predistort the transmitted pulses to enhance correspondence between (1) the transmitted pulse as received by the receiver after distortion by the transmission medium and (2) the predetermined pulse shape;

a selection circuit responsive to the classification circuit and connected to the shaping circuit, to automatically control the shaping circuit to select one of the plurality of alternative pulse shapes to correspond to the category in which the transmission medium is classified by the classification circuit; and means, included in the transmitter, for transmitting on the metallic transmission medium the data signal as shaped by the shaping means.

* * * * *